United States Patent

Yamaguchi et al.

Patent Number: 5,321,281
Date of Patent: Jun. 14, 1994

[54] INSULATED GATE SEMICONDUCTOR DEVICE AND METHOD OF FABRICATING SAME

[75] Inventors: Hiroshi Yamaguchi; Hiroyasu Hagino; Yoshifumi Tomomatsu, all of Fukuoka, Japan

[73] Assignee: Mitsubishi Denki Kabushiki Kaisha, Tokyo, Japan

[21] Appl. No.: 27,939

[22] Filed: Mar. 8, 1993

[30] Foreign Application Priority Data

Mar. 18, 1992 [JP] Japan .................. 4-062154

[51] Int. Cl.$^5$ .................................. H01L 29/00
[52] U.S. Cl. ..................... 257/212; 257/139; 257/147; 257/328; 257/341; 257/378
[58] Field of Search ............. 257/137, 138, 139, 147, 257/148, 149, 152, 153, 212, 328, 329, 341, 342, 372

[56] References Cited

U.S. PATENT DOCUMENTS 4,816,892  3/1989  Temple .................. 257/149
5,047,813  9/1991  Harada .................. 257/139

FOREIGN PATENT DOCUMENTS 1-300569  12/1989  Japan .................. 257/378
2-106073  4/1990  Japan .

Primary Examiner—Sara W. Crane
Attorney, Agent, or Firm—Oblon, Spivak, McClelland, Maier & Neustadt

[57] ABSTRACT

An improved insulated gate semiconductor device comprises a high-concentration p-type semiconductor region formed widely enough to protrude over n-type emitter regions without reaching an n-type epitaxial layer over a p-type base region only in first regions wherein the n-type emitter regions are wider than second regions as viewed from the top of the device. A gate threshold voltage $V_{GE}(th)$ has a relatively high level $V_{GE}(th\text{-High})$ in the first regions, so that a low collector-emitter saturation voltage $V_{CE}(sat)$ and a low saturation current $I_{CE}(sat)$ are achieved. This provides for a high short-circuit tolerance as well as a high latch-up tolerance with low losses.

10 Claims, 42 Drawing Sheets

F I G . 9
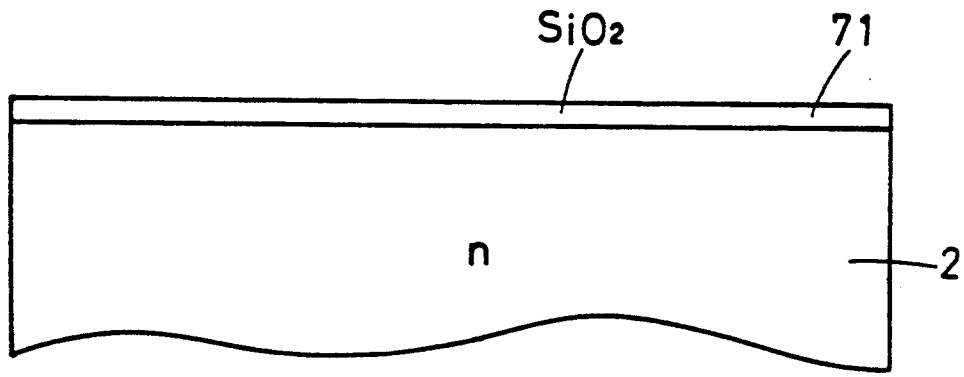

INSULATED GATE SEMICONDUCTOR DEVICE AND METHOD OF FABRICATING SAME

BACKGROUND OF THE INVENTION

1. Field of the Invention

The present invention relates to an insulated gate semiconductor device such as an insulated gate bipolar transistor (hereinafter referred to as an IGBT) and a method of fabricating the same. More particularly, the invention relates to an improvement in short-circuit tolerance.

2. Description of the Background Art

1. Structure of Conventional Device

FIG. 40 is a plan view of a conventional N-channel IGBT 100. The IGBT 100 comprises a multiplicity of IGBT elements (hereinafter referred to as IGBT unit cells) 110 connected in parallel, only one of which is illustrated. An emitter electrode 7 and an oxide film 8 to be described later with reference to FIG. 41 are not illustrated in FIG. 40. The configurations of various mask patterns to be used in the process steps for fabricating the IGBT 100 are also shown in FIG. 40. FIGS. 41 and 42 are cross-sectional views of one of the IGBT unit cells 110 taken along the lines A—A and B—B of FIG. 40, respectively. A circuit diagram of an equivalent circuit of the IGBT unit cell 110 is also illustrated in FIG. 41.

Referring to FIGS. 41 and 42, the IGBT unit cell 110 includes a p-type collector layer 1 which is a p-type semiconductor substrate and an n-type epitaxial layer 2. The layers 1 and 2 form a semiconductor body 120. A p-type base region 3 is formed in a partial region in the top major surface of the n-type epitaxial layer 2 or the semiconductor body 120 by selective diffusion of p-type impurities. In a partial region in the top major surface of the semiconductor body 120 are also formed n-type emitter regions 4 by selective diffusion of n-type impurities. A gate insulating film 5 is formed to cover the top surface of the p-type base region 3 between the top surface of the n-type epitaxial layer 2 and the top major surface of the n-type emitter regions 4. The gate insulating films 5 for adjacent IGBT unit cells 110 are integrally formed on the top surface of the n-type epitaxial layer 2. A gate electrode 6 made of, for example, polycrystalline silicon (hereinafter referred to as polysilicon) is formed on the gate insulating film 5. The emitter electrode 7 made of, for example, aluminum is formed such that it is electrically connected to both the p-type base region 3 and the n-type emitter regions 4. The gate electrode 6 and the emitter electrode 7 are insulated from each other by an oxide film 8 serving as inter-layer insulating film, and are electrically connected in common in and between all of the IGBT unit cells 110. A high-concentration p-type semiconductor region 31 is formed in the p-type base region 3 through diffusion of p-type impurities at high concentration in a pattern which surrounds the n-type emitter regions 4. A collector electrode 9 made of metal is formed on the bottom major surface of the p-type collector layer 1 integrally for all of the IGBT unit cells 110.

As shown in FIG. 40, the IGBT cell 110 has regions in which the n-type emitter regions 4 are relatively wide as viewed from the top and regions in which they are relatively narrow. The region around the line A—A is one of the former regions while the region around the line B—B is one of the latter regions. The dotted lines of FIG. 40 represent a mask pattern 51 to be used for formation of the gate electrode 6, a mask pattern 52 to be used for formation of the high-concentration p-type semiconductor region 31, and a mask pattern 53 to be used for formation of the n-type emitter regions 4 in a process of fabricating the IGBT 100.

2. Operation of Conventional Device

Referring to FIG. 41, the IGBT unit cell 110 includes an insulated gate field effect transistor MOS, which may be a metal-oxide-semiconductor transistor and is hereinafter referred to as an MOSFET, a pnp bipolar transistor Tr1, an npn bipolar transistor Tr2, and a resistance Rb. These elements are equivalently connected to each other as shown in the equivalent circuit diagram of FIG. 41.

When a gate voltage $V_{GE}$ is applied across the gate and emitter electrodes 6 and 7 with a collector voltage $V_{CE}$ applied across the collector and emitter electrodes 9 and 7, the p-type semiconductor in the top surface of the p-type base region 3 between the n-type emitter regions 4 and n-type epitaxial layer 2 is inverted into an n-type semiconductor to form n-type channels. Then conduction is permitted between the n-type epitaxial layer 2 serving as a drain of the MOSFET and the n-type emitter regions 4 serving as a source thereof, and an electronic current flows from the n-type emitter regions 4 through the n-type channels into the n-type epitaxial layer 2. The electronic current serves as a base current for the transistor Tr1. In response to the electronic current, holes are introduced from the p-type collector layer 1 into the n-type epitaxial layer 2. Some of the introduced holes are recombined with the carrier electrons in the n-type epitaxial layer 2, and the other holes flow through the p-type base region 3 into the emitter electrode 7 to provide a hole current. As a result, the IGBT 100 conducts or turns on, that is, conduction is permitted across the collector and emitter electrodes 9 and 7.

The IGBT 100, a voltage-controlled transistor having insulated gates (MOS gates) like the MOSFET, is advantageous in that a drive circuit of the IGBT 100 is constructed more simply than that of bipolar transistors and in that a collector-emitter saturation voltage (ON-voltage) lower than that of the MOSFET is achieved. The latter advantage is provided because the holes introduced from the p-type collector layer 1 into the n-type epitaxial layer 2 cause a conductivity modulation so that the resistance of the n-type epitaxial layer 2 effectively becomes low.

When the gate voltage $V_{GE}$ is a zero voltage or is zero-biased or when it is a negative voltage or is negatively biased, the MOSFET enters a cut-off state so that the electronic current stops flowing. As a result, the IGBT 100 is cut off. However, accumulated holes remain in the n-type epitaxial layer 2 during the transition period in which the transition from ON to OFF starts. A certain period of time (turn-off time) is required for the holes accumulated in the course of the transition to disappear. During the turn-off period, the hole current continues flowing while decaying. The accumulated holes are useful for achieving a low saturation voltage when the IGBT 100 is on but are a factor prolonging the turn-off time when the IGBT 100 turns off. Hence the amount of holes to be introduced in the ON-state or the lifetime thereof should be optimized.

The IGBT unit cell 110 includes a parasitic thyristor formed by the n-type emitter regions 4, the p-type base region 3, the n-type epitaxial layer 2 and the p-type collector layer 1. The parasitic effect which is turn-on of the parasitic thyristor associated with the operation of the IGBT 10 sometimes prevents the original function of the IGBT 100. It is therefore necessary to suppress the parasitic effect. One of the effective approaches for suppression of the parasitic effect is to decrease the lateral resistance Rb of a part of the p-type base region 3 which lies just under the n-type emitter regions 4. For decrease in the resistance Rb, there has been proposed an arrangement shown in FIGS. 41 and 42 in which the high-concentration p-type semiconductor region 31 is provided just under the n-type emitter regions 4, which is disclosed in Japanese Patent Application Laid-Open No. 60-196974 (1985), for example. As illustrated in FIGS. 41 and 42, the high-concentration p-type semiconductor region 31 is formed on the inside of the n-type emitter regions 4 for the purpose of exerting no influence on a gate threshold voltage. That is, the high-concentration p-type semiconductor region 31 is formed such that the region 31 itself is not included in the n-type channels to be formed in the p-type base region 3 when the gate voltage $V_{GE}$ is applied.

3. Disadvantage of Conventional Device

The IGBT 100 is often used for an inverter device and the like. It is hence necessary that the IGBT 100 is not broken down when the inverter device is short-circuited or when the IGBT 100 turns on with a short-circuit voltage applied thereto. The resistance to short-circuit of the IGBT 100 (short-circuit tolerance) decreases in proportion to the product of the voltage and the current when the IGBT 100 is short-circuited and a short-circuit time. The IGBT 100 having a small chip area, in particular, has a low short-circuit tolerance.

The voltage at the time of short-circuit and the short-circuit time are determined by the conditions under which the IGBT 100 is used, e.g., the operating conditions of the inverter. Since the IGBT 100, when short-circuited, is saturated, the current at the time of the short-circuit is just a saturation current $I_{CE}(sat)$ of the IGBT 100. The establishment of a low saturation current $I_{CE}(sat)$ is effective for improving the short-circuit tolerance. The saturation current $I_{CE}(sat)$ is determined by:

$$I_{CE}(sat) \propto \frac{1}{2 \cdot (1 - \alpha pnp)} \cdot C_{ox} \cdot \mu n \cdot \frac{W}{L} \cdot (V_{GE} - V_{GE}(th))^2 \quad (1)$$

where:
$\alpha pnp$ is a current transfer ratio of the pnp transistor;
$C_{ox}$ is a gate capacitance;
$\mu n$ is a surface mobility;
W is a channel width;
L is a channel length;
$V_{GE}$ is the gate voltage; and
$V_{GE}(th)$ is the gate threshold voltage.

For reduction in losses where the IGBT 100 is applied as a switching element to the inverter and the like, a small collector-emitter saturation voltage $V_{CE}(sat)$ is required. One of the effective schemes for decrease in collector-emitter saturation voltage $V_{CE}(sat)$ is to improve the electrical characteristics of a portion corresponding to the MOSFET (the portion MOS of FIG. 41) in the IGBT unit cell 110 to reduce a drop voltage when the MOS is conducting. For example, a shallow diffusion is carried out in a diffusing step for forming the p-type base region 3 to shorten the channel length L of the MOS. Otherwise, the IGBT unit cell 110 is reduced in size and increased in density by reducing the width of the p-type base region 3 (the whole lateral width of the p-type base region 3 of FIGS. 41, 42), to thereby relatively increase the total of the channel widths W for the whole IGBT 100.

However, either shortening the channel length L or increasing the channel width W for reduction in collector-emitter saturation voltage $V_{CE}(sat)$ is accompanied by increase in saturation current $I_{CE}(sat)$ as will be understood from Formula (1). Then the parasitic thyristor causes latch-up to break down the IGBT 100, or otherwise the product of the voltage and current at the time of short-circuit grows large, so that the short-circuit tolerance falls off. The conventional IGBT 100 is, therefore, disadvantageous in that low losses when used as a switching element cannot coexist with high short-circuit tolerance.

SUMMARY OF THE INVENTION

According to the present invention, an insulated gate semiconductor device comprises: (a) a semiconductor body comprising: (a-1) a first semiconductor region of a first conductivity type exposed at a top major surface of the semiconductor body; (a-2) a second semiconductor region of a second conductivity type selectively formed in a top surface portion of the first semiconductor region and selectively exposed at the top major surface of the semiconductor body; (a-3) a third semiconductor region of the first conductivity type selectively formed in a top surface portion of the second semiconductor region and exposed at the top major surface of the semiconductor body on the inside of a peripheral edge portion of the exposed surface of the second semiconductor region, wherein the third semiconductor region defines a pattern on the top major surface of the semiconductor body, the pattern including a pair of strip areas arranged in parallel across a central area; (a-4) a fourth semiconductor region of the second conductivity type having an impurity concentration higher than an impurity concentration of the second semiconductor region and selectively formed in a top surface portion of the semiconductor body so as to surround the third semiconductor region, the fourth semiconductor region comprising: a first portion exposed at the top major surface of the semiconductor body in the central area; and a second portion exposed at the top major surface of the semiconductor body in an external area selectively defined on the outside of the pair of strip areas; (b) an insulating layer selectively formed on the top major surface of the semiconductor body and having an opening on a predetermined region covering part of the pair of strip areas and at least part of the central area; (c) a control electrode layer buried in the insulating layer and opposed to a section between the pair of strip areas and the exposed surface of the first semiconductor region; (d) a first main electrode layer formed in the opening and electrically connected to a portion of the top major surface of the semiconductor body exposed in the opening; and (e) a second main electrode layer formed on a bottom major surface of the semiconductor body and electrically connected to the semiconductor body.

In the insulated gate semiconductor device of the present invention, the first and third semiconductor regions of the first conductivity type are exposed at the top major surface of the semiconductor body. In some portions, the second semiconductor region of the second conductivity type is exposed throughout the section between the exposed surfaces of the first and third semiconductor regions. In the other portions, the fourth semiconductor region of the second conductivity type having the high impurity concentration is partially exposed in the section. The control electrode layer is opposed to the section. When a voltage is applied to the control electrode layer, an inverted layer is formed in the section so that conduction is permitted between the first and third semiconductor regions. Since the second semiconductor region has the relatively low impurity concentration of the second conductivity type and the fourth semiconductor region has the relatively high impurity concentration, a gate threshold voltage $V_{GE}(th)$ to be applied to the control electrode layer for the formation of the inverted layer is relatively low in the former portions and relatively high in the latter portions in the section.

The insulated gate semiconductor device includes the portions having a relatively low gate threshold voltage $V_{GE}(th)$ and a relatively high gate threshold voltage $V_{GE}(th)$ which are connected in parallel in the section in which the inverted layer is to be formed. The gate threshold voltage of the device mainly depends on the portion having the low gate threshold voltage $V_{GE}(th)$ and is not largely varied by the provision of the portion having the high gate threshold voltage $V_{GE}(th)$. An collector-emitter saturation voltage $V_{CE}(sat)$ is not largely affected by the provision of the portion having the high gate threshold voltage $V_{GE}(th)$. On the other hand, a saturation current $I_{CE}$ strongly depends on the percentage of the portion having the high gate threshold voltage $V_{GE}(th)$ and is decreased as the percentage increases. Increase in saturation current $I_{CE}(sat)$ generated by size reduction and density increase of the semiconductor device is prevented by the provision of the portion having the high gate threshold voltage $V_{GE}(th)$. By optimizing the distribution of the portions having the high and low gate threshold voltage $V_{GE}(th)$ for the small and dense semiconductor devices which provide a low collector-emitter saturation voltage $V_{CE}(sat)$ and low losses, the saturation current $I_{CE}(sat)$ is reduced to achieve a semiconductor device having a high short-circuit tolerance.

Preferably, the area size of the pair of strip areas exposed in the opening is not more than 50% of the area size of the opening.

The ratio of the third and fourth semiconductor regions electrically connected to the first main electrode layer is optimized, so that a small saturation current $I_{CE}(sat)$ and, accordingly, a high short-circuit tolerance are provided.

In an aspect of the present invention, the external area has a plurality of unit external areas periodically aligned at a predetermined period in an elongated direction of the pair of strip areas, and the length of each unit external area in the elongated direction of the pair of strip areas is not less than 20% of the period.

The percentage of the part of the pair of beltlike areas bordering on the external area, that is, the percentage of the inverted layer having the relatively high gate threshold voltage $V_{GE}(th)$ is optimized, so that the small saturation current $I_{CE}(sat)$ and, accordingly, the high short-circuit tolerance are provided.

The present invention is also directed to a method of fabricating an insulated gate semiconductor device.

According to the present invention, the method comprises the steps of: (a) providing a semiconductor body including a first semiconductor region of a first conductivity type exposed at a top major surface of the semiconductor body; (b) forming an oxide film on the top major surface of the semiconductor body; (c) forming a control electrode layer having a first opening of a substantially strip configuration on the oxide film; (d) obtaining a second semiconductor region of the second conductivity type under the first opening, wherein the second semiconductor region selectively extending to part of the semiconductor body underlying the control electrode layer; (e) selectively providing a mask pattern on the oxide film and the control electrode layer, the mask pattern being provided with a second opening partially overlapped with the first opening; (f) obtaining in the semiconductor body under the second opening a third semiconductor region of the second conductivity type having a impurity concentration higher than the impurity concentration of the second semiconductor region, wherein third semiconductor region selectively extends to part of the semiconductor body underlying the control electrode layer; (g) selectively removing a portion of the oxide film lying under the first opening to obtain a pair of strip windows arranged substantially in parallel and an oxide region remaining on a central area defined between the pair of strip windows; (h) selectively introducing a third impurity of the first conductivity type into the top major surface of the semiconductor body using the oxide region and the oxide film lying under the control electrode layer as a mask to obtain a fourth semiconductor region of the first conductivity type in the third semiconductor region; (i) removing the oxide region; (j) forming an insulating layer having a third opening on a predetermined region of the top major surface of the semiconductor body covering part of the pair of strip areas and at least part of the central area, the insulating layer covering side and top surfaces of the control electrode layer; (k) providing in the third opening a first main electrode layer electrically connected to the top major surface of the semiconductor body; and (l) forming on a bottom major surface of the semiconductor body a second main electrode layer electrically connected to the bottom major surface of the semiconductor body.

The method of the present invention affords the fabrication of the insulated gate semiconductor device having the foregoing advantages.

Accordingly, an object of the present invention is to provide an insulated gate semiconductor device having a high short-circuit tolerance and an improved latch-up tolerance with low losses.

Another object of the invention is to provide a method of suitably fabricating the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8 to 21 are cross-sectional views showing process steps for fabrication of the IGBT of FIG. 1;

DESCRIPTION OF THE PREFERRED EMBODIMENTS

1. First Preferred Embodiments 1-1. Structure of Device

Figure 1:
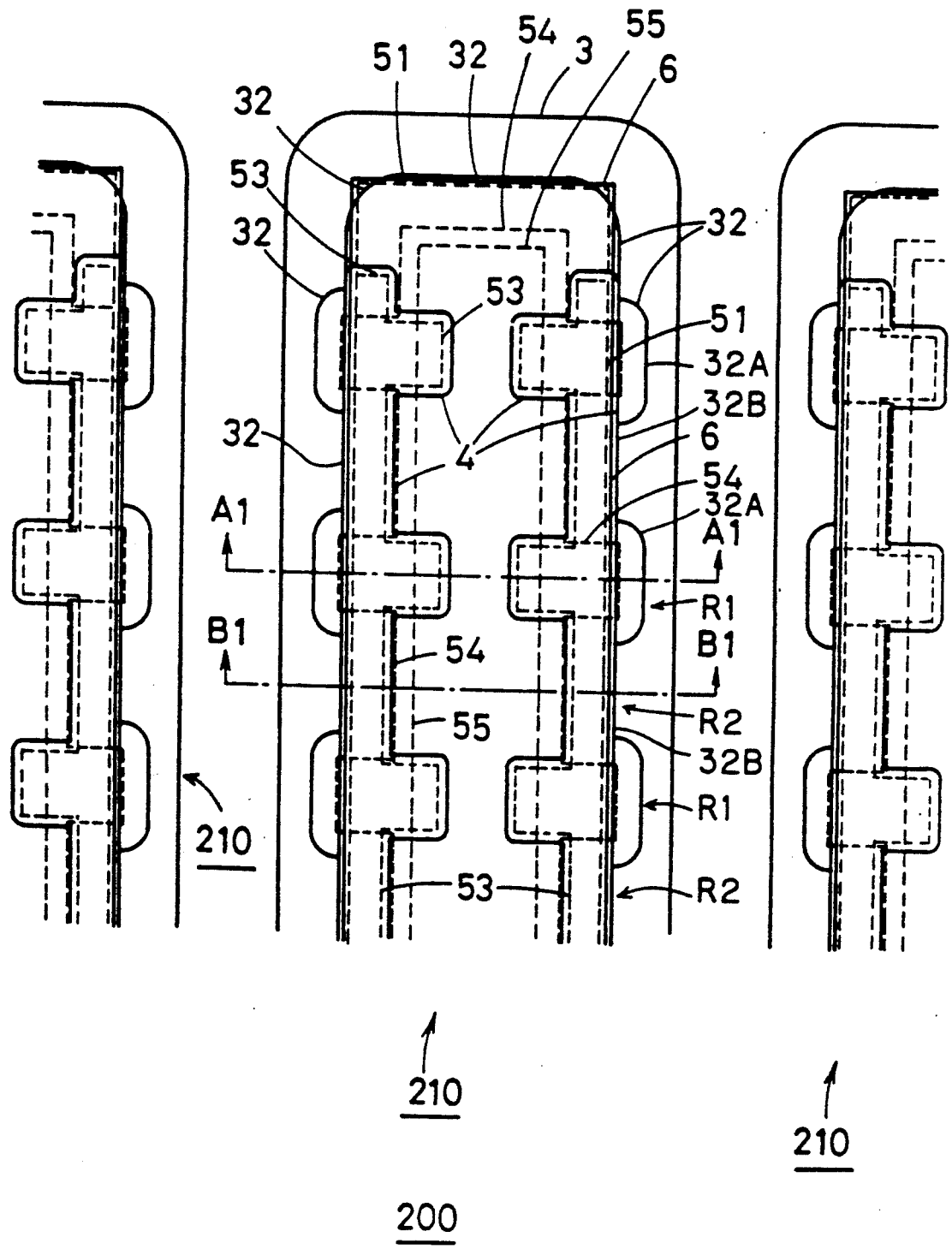
FIG. 1 is a plan view of an N-channel IGBT according to a first preferred embodiment of the present invention.
Figure 2:
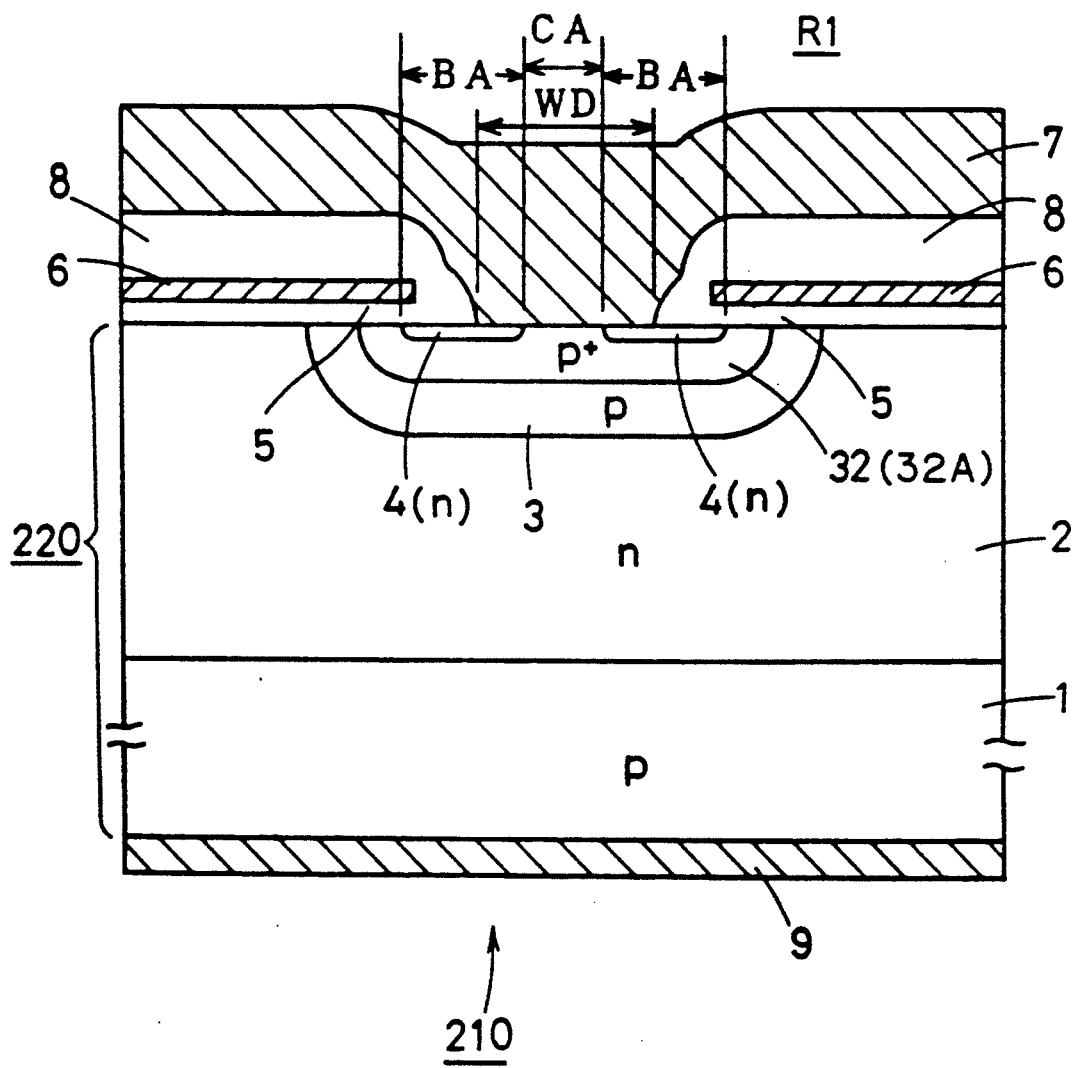
FIG. 2 is a cross-sectional view taken along the line A1—A1 of FIG. 1.
Figure 3:
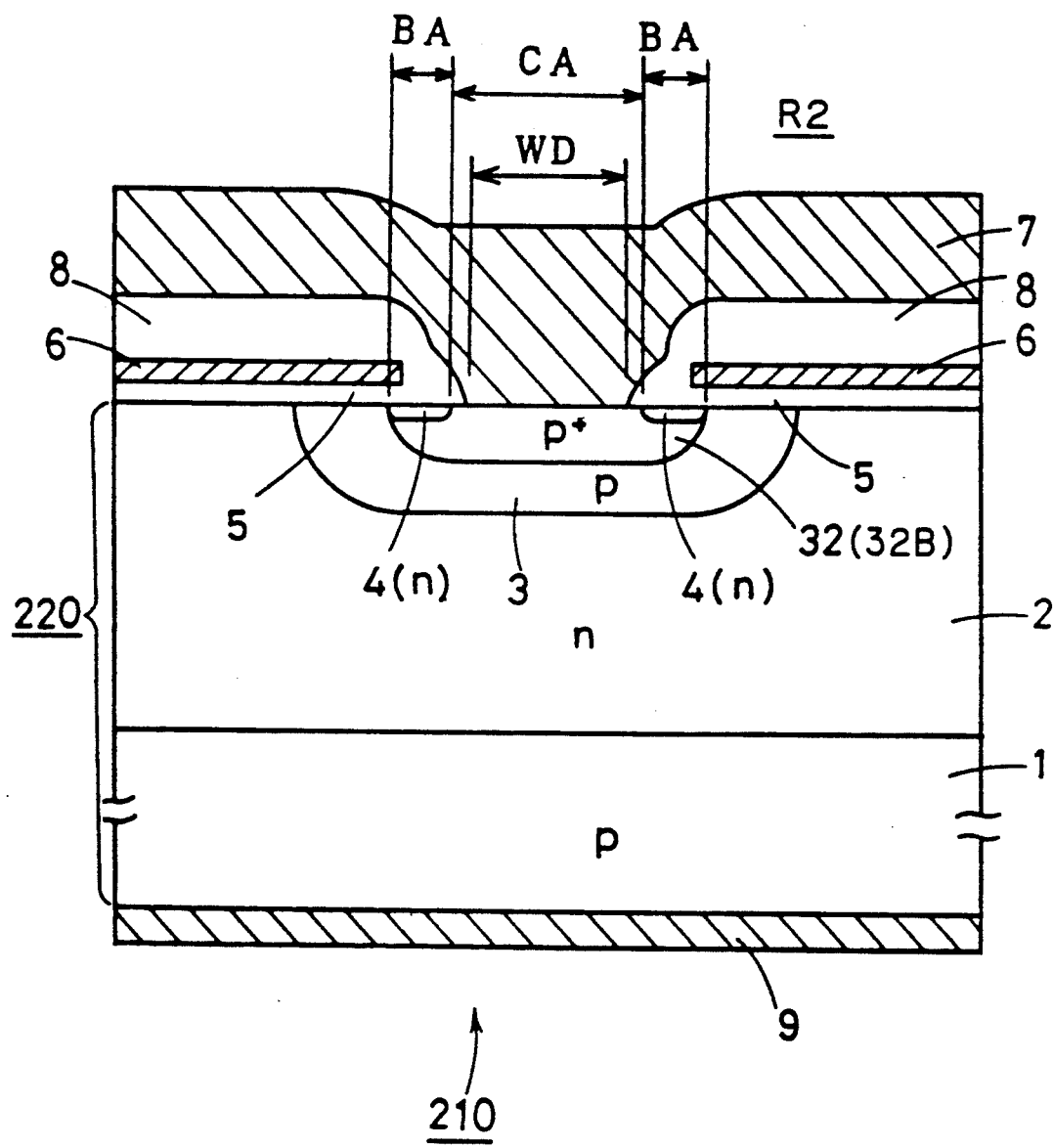
FIG. 3 is a cross-sectional view taken along the line B1—B1 of FIG. 1.
Figure 40:
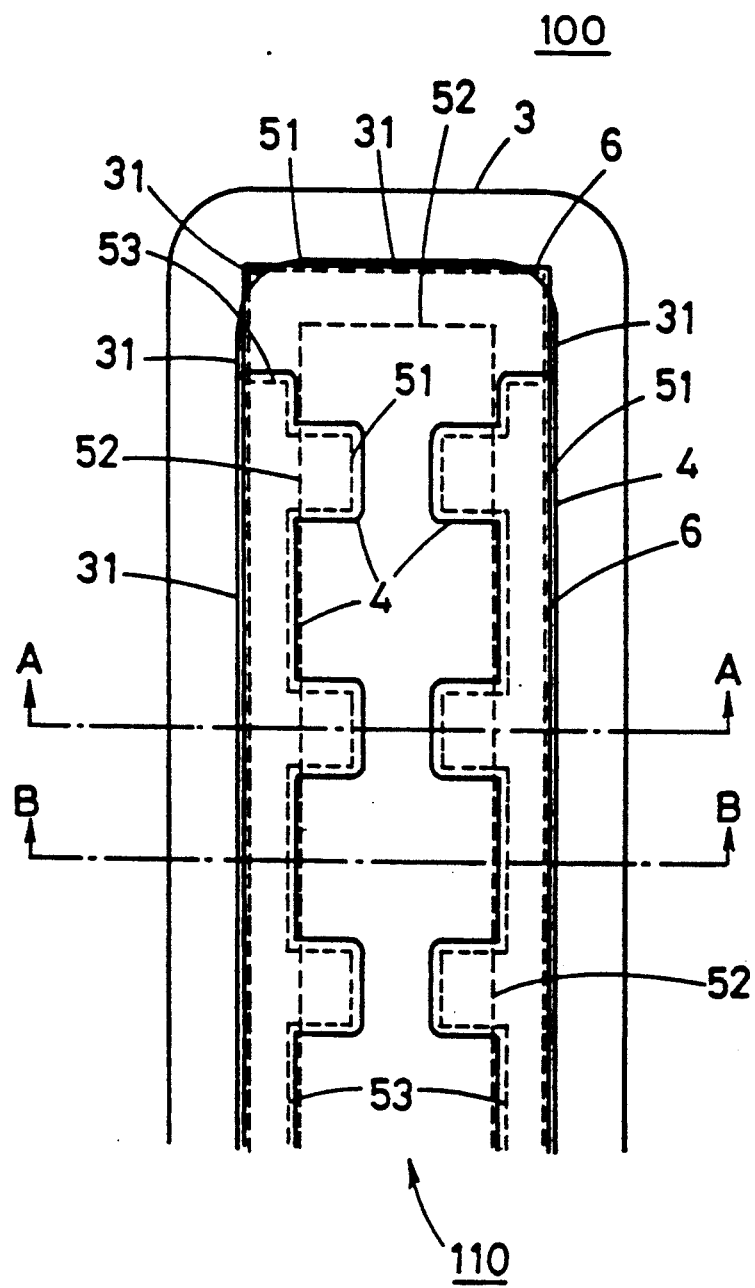
FIG. 40 is a plan view of a conventional N-channel IGBT.
Figure 41:
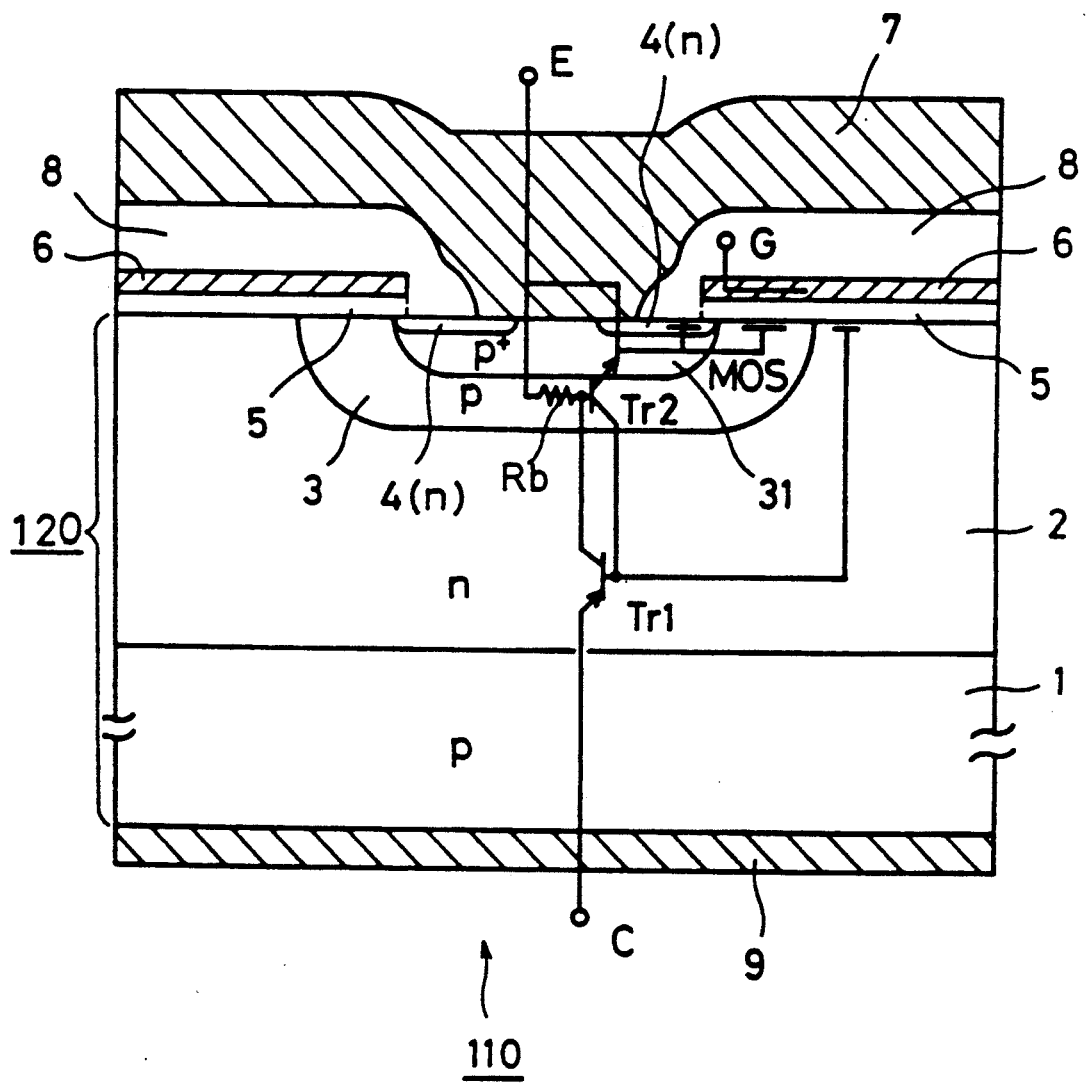
FIG. 41 is a cross-sectional view taken along the line A—A of FIG. 40.
Figure 42:
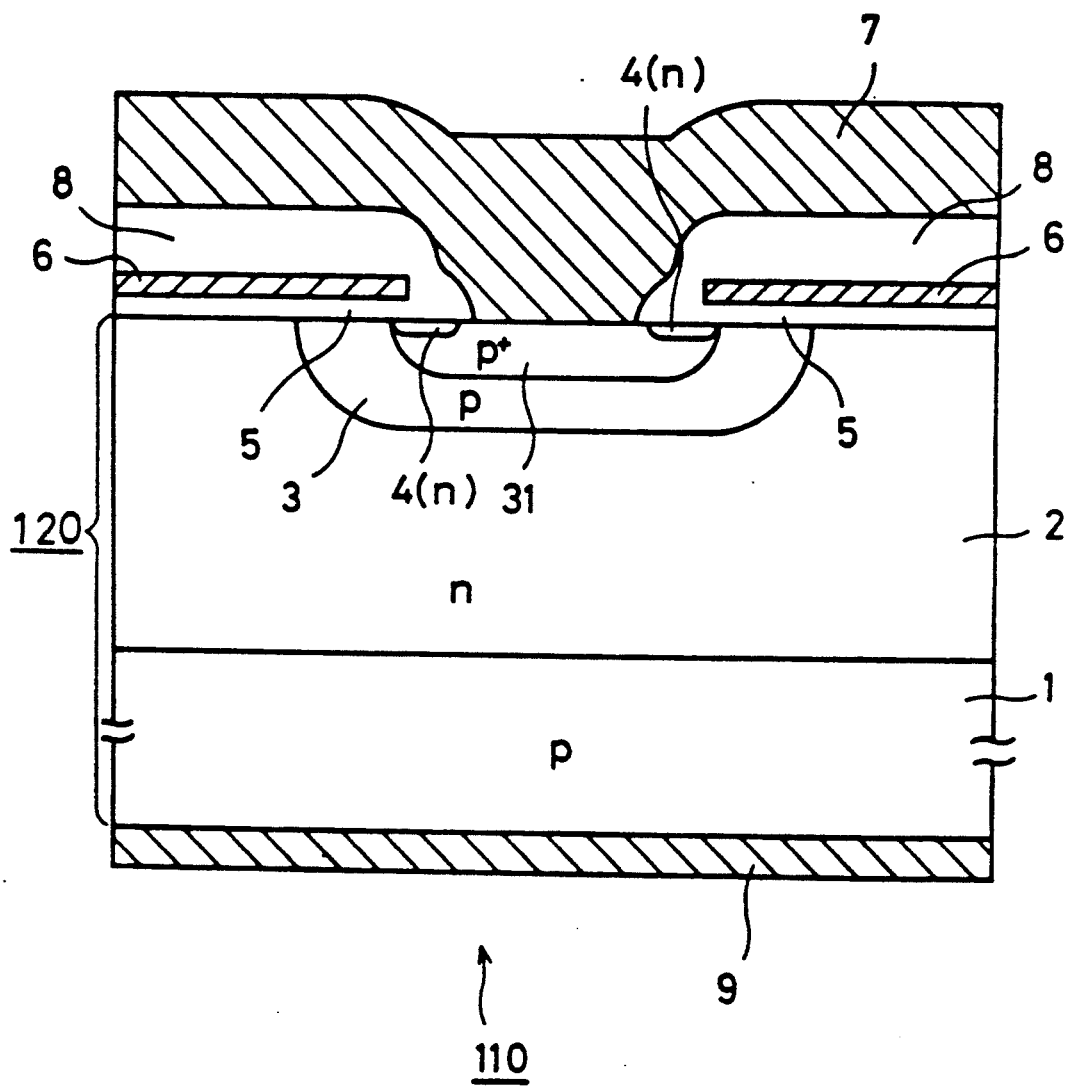
FIG. 42 is a cross-sectional view taken along the line B—B of FIG. 40.

FIG. 1 is a plan view of an N-channel IGBT 200 according to a first preferred embodiment of the present invention. The IGBT 200 comprises a multiplicity of IGBT unit cells 210 connected in parallel. Although the IGBT 200 has an emitter electrode 7 and an oxide film 8 as described later, they are not illustrated in FIG. 1. The configurations of various mask patterns to be used in process steps for fabricating the IGBT 200 are depicted in FIG. 1. FIGS. 2 and 3 are cross-sectional views of one of the IGBT unit cells 210 taken along the lines A1—A1 and B1—B1 of FIG. 1, respectively. Since the respective IGBT unit cells 210 have substantially the same structure, the constitution of the whole IGBT 200 will be understood from FIGS. 1 to 3. Like reference numerals and characters are used to designate parts corresponding to those of the conventional device of FIGS. 40 to 42.

With reference to FIGS. 2 and 3, the IGBT 200 comprises a p-type collector layer 1 which is a p-type semiconductor substrate, and an n-type epitaxial layer 2. The layers 1 and 2 form a semiconductor body 220. A p-type base region 3 is formed in a partial region in the top major surface of the n-type epitaxial layer 2 or the semiconductor body 220 by selective diffusion of p-type impurities. In a partial region in the top major surface of the semiconductor body 220 are also formed n-type emitter regions 4 by selective diffusion of n-type impurities. The n-type emitter regions 4 are exposed in a pair of substantially parallel beltlike or strip areas BA separated from each other by a predetermined central area CA. A gate insulating film 5 is formed to cover the top surface of the p-type base region 3 between the top surface of the n-type epitaxial layer 2 and the top major surface of the n-type emitter region 4. The gate insulating films 5 for adjacent IGBT unit cells 210 are integrally formed on the top surface of the n-type epitaxial layer 2. A gate electrode 6 made of, for example, polysilicon is formed on the gate insulating film 5. The emitter electrode 7 made of, for example, aluminum is formed such that it is electrically connected to both the p-type base region 3 and n-type emitter regions 4. The gate electrode 6 and emitter electrode 7 are insulated from each other by the oxide film 8 serving as a layer insulating film, and are electrically connected in common in and between all of the IGBT unit cells 210. The oxide film 8 has an opening or window WD in a predetermined region covering part of the beltlike areas BA and at least part of the central area CA as shown in FIGS. 2 and 3. A high-concentration p-type semiconductor region 32 is formed in the p-type base region 3 by diffusion of p-type impurities at high concentration in a pattern which surrounds the n-type emitter regions 4. A collector electrode 9 made of metal is formed on the bottom major surface of the p-type collector layer 1 integrally for all of the IGBT unit cells 210.

As shown in FIG. 1, the IGBT unit cell 210 includes first regions R1 in which the n-type emitter regions 4 are relatively wide as viewed from the top and second regions R2 in which they are relatively narrow as viewed from the top. The line A1—A1 crosses one of the first regions R1 while the line B1—B1 crosses one of the second regions R2. The dotted lines of FIG. 1 represent a mask pattern 51 to be used for formation of the gate electrode 6, a mask pattern 53 to be used for formation of the n-type emitter regions 4, a mask pattern 54 to be used for formation of the high-concentration p-type semiconductor region 32, and a mask pattern 55 to be used in a contact process step of removing the oxide film 8 for electrical connection of the p-type base region 3 and n-type emitter regions 4 to the emitter electrode 7, in the fabrication process.

As shown in FIGS. 1 and 2, first parts 32A of the high-concentration p-type semiconductor region 32 in the first regions R1 extends widely enough to protrude outwardly over the n-type emitter regions 4 but does not reach the n-type epitaxial layer 2 over the p-type base region 3. On the other hand, as shown in FIGS. 1 and 3, second parts 32B of the high-concentration p-type semiconductor region 32 in the second regions R2 are relatively narrow and the outer edges thereof are coincident with the outer edges of the n-type region 4. Correspondingly, the mask pattern 54 is wider on the first regions R1 than on the second regions R2.

1-2. Operation and Characteristic of Device

When a positive gate voltage $V_{GE}$ is positively applied across the gate and emitter electrodes 6 and 7 with a collector voltage $V_{CE}$ applied across the collector and emitter electrodes 9 and 7, the p-type semiconductor in the top surface of the p-type base region 3 between the n-type emitter regions 4 and n-type epitaxial layer 2 is inverted into an n-type semiconductor to form n-type channels. Then, conduction is permitted between the n-type epitaxial layer 2 serving as a drain of an MOSFET equivalently formed in the IGBT unit cell 210 and the n-type emitter regions 4 serving as a source thereof, and an electronic current flows from the n-type emitter regions 4 through the n-type channels into the n-type epitaxial layer 2. The electronic current serves as a base current for a pnp bipolar transistor equivalently formed by the p-type collector layer 1, n-type epitaxial layer 2, and p-type base region. In response to the electronic current, holes are introduced from the p-type collector layer 1 into the n-type epitaxial layer 2. Some of the introduced holes are recombined with carrier electrons in the n-type epitaxial layer 2, and the other holes flow through the p-type base region 3 into the emitter electrode 7 in the form of a hole current. As a result, the IGBT 200 conducts (turns on), that is, conduction is permitted across the collector and emitter electrodes 9 and 7.

When the gate voltage $V_{GE}$ is a zero voltage or is zero-biased or when it is a negative voltage or is negatively biased, the equivalently formed MOSFET enters the cut-off state, so that the electronic current stops flowing. As a result, the IGBT 200 is cut off.

Since the high-concentration p-type semiconductor region 32 is of the above-mentioned configuration in the first regions R1, the n-type channels defined between the n-type emitter regions 4 and n-type epitaxial layer 2 by the application of the positive gate voltage $V_{GE}$ includes series connection of the inverted layer of the p-type base region 3 and the inverted layer in the first part 32A of the high-concentration p-type semiconductor region 32. On the other hand, since the second parts 32B of the high-concentration p-type semiconductor region 32 is formed on the inside of the n-type emitter regions 4 as viewed from the top, the n-type channels are formed by only the inverted layer of the n-type base region 3.

A gate threshold voltage $V_{GE}(th)$ that is the level of the gate voltage required for the formation of the inverted layers is higher in the high-concentration p-type semiconductor region 32 than that in the p-type base region 3. Thus the gate threshold voltage $V_{GE}(th)$ is a relatively high voltage $V_{GE}(th\text{-High})$ in the first regions R1, and is a relatively low voltage $V_{GE}(th\text{-Low})$ in the second regions R2. The n-type channels to be formed between the n-type emitter regions 4 and n-type epitaxial layer 2 are formed by parallel connection of the n-type channels having the relatively high gate threshold voltage $V_{GE}(th\text{-High})$ and the n-type channels having the relatively low gate threshold voltage $V_{GE}(th\text{-Low})$.

The gate threshold voltage $V_{GE}(th)$ for the whole IGBT 200 is defined by the gate voltage $V_{GE}$ when a collector current Ic (a current flowing between the collector electrode 9 and emitter electrode 7) starts rising from zero as the gate voltage $V_{GE}$ increases. In other words, it is the gate voltage $V_{GE}$ when the collector current Ic reaches a certain specified level established considerably lower than its rated value which is a maximum value in normal use. For this reason, the gate threshold voltage $V_{GE}(th)$ is mainly determined by the relatively low gate threshold voltage $V_{GE}(th\text{-Low})$ and is approximately equal thereto. In the device 200 according to the first preferred embodiment, the provision of the n-type channels having the relatively high gate threshold voltage $V_{GE}(th\text{-High})$ has little influence on the gate threshold voltage $V_{GE}(th)$ for the whole IGBT 200. The provision of the n-type channels having the relatively high gate threshold voltage $V_{GE}(th\text{-High})$ has a small influence on a collector-emitter saturation voltage $V_{GE}(sat)$ in the structure of FIGS. 1 to 3, but has a relatively significant influence on a saturation current $I_{GE}(sat)$ to be described below.

The impurity concentration of the high-concentration p-type semiconductor region 32 in the IGBT 200 is selected such that the relatively high gate threshold voltage $V_{GE}(th\text{-High})$ becomes lower than the predetermined gate voltage $V_{GE}$ when the IGBT 200 turns on, that is, as given by:

$$V_{GE}(th\text{-Low}) < V_{GE}(th\text{-High}) < V_{GE} \text{ in the ON-state} \qquad (2)$$

When the gate threshold voltage $V_{GE}(th)$ is the ON-state voltage under the conditions of the Formula (2), a large degree of inversion occurs in the n-type channels having the relatively low gate threshold voltage $V_{GE}(th\text{-Low})$ and a small degree of inversion occurs in the high-concentration p-type semiconductor region 32 in the n-type channels having the relatively high gate threshold voltage $V_{GE}(th\text{-High})$. As an example, the gate threshold voltage $V_{GE}(th\text{-High})$ of about 10 V is selected where the gate threshold voltage $V_{GE}(th\text{-Low})$ is about 5 V and the ON-state gate voltage $V_{GE}$ is 15 V. From Formula (1) is derived:

$$I_{CE}(sat) \propto W \cdot (V_{GE} - V_{GE}(th))^2 \qquad (3)$$

From the Formula (3), the saturation current $I_{CE}(sat)$ flowing when the IGBT 200 is short-circuited decreases as the proportion of the n-type channels having the relatively high gate threshold voltage $V_{GE}(th\text{-High})$ in the width W of the n-type channels increases.

Thus, the device 200 according to the first preferred embodiment achieves low collector-emitter saturation voltage $V_{CE}(sat)$, low saturation current and, accordingly, high short-circuit tolerance by optimization of the proportion of the n-type channels having the relatively high gate threshold voltage $V_{GE}(th\text{-High})$ in the whole n-type channels even when the IGBT unit cells 210 are reduced in size and increased in density.

The device 200 according to the first preferred embodiment including the first regions R1 and the second regions R2 has the advantage of size reduction in the IGBT unit cells 210 with an ensured insulator breakdown voltage across the gate and emitter electrodes 6 and 7 and an ensured electrical connection of the n-type emitter regions 4 and high-concentration p-type semiconductor region 32 to the emitter electrode 7.

In addition, since the high-concentration p-type semiconductor region 32 is widely formed in the first regions R1, the device 200 provides the advantage of effective suppression of the parasitic thyristor effect.

1-3. Measurements of Characteristics of Device

Description will be given on the measurements of electrical characteristics of the IGBT 200 of the first preferred embodiment. For decreasing the collector-emitter saturation voltage $V_{CE}(sat)$ of the IGBT 200, it is effective to improve the characteristics of the MOSFET region to be equivalently formed in the IGBT unit cell 210 as above described. One of the improvements is to make the p-type base region 3 as narrow as possible for size reduction and density increase of the IGBT unit cell 210 and, accordingly, to relatively increase the channel width W of the MOSFET region. For reducing the width of the p-type base region 3, it is preferable that the IGBT unit cell 210 includes a teeth-like n-type emitter pattern shown in FIG. 4 in which the opposed n-type emitter regions 4 are connected with each other and form a lattice shape.

Figure 4:
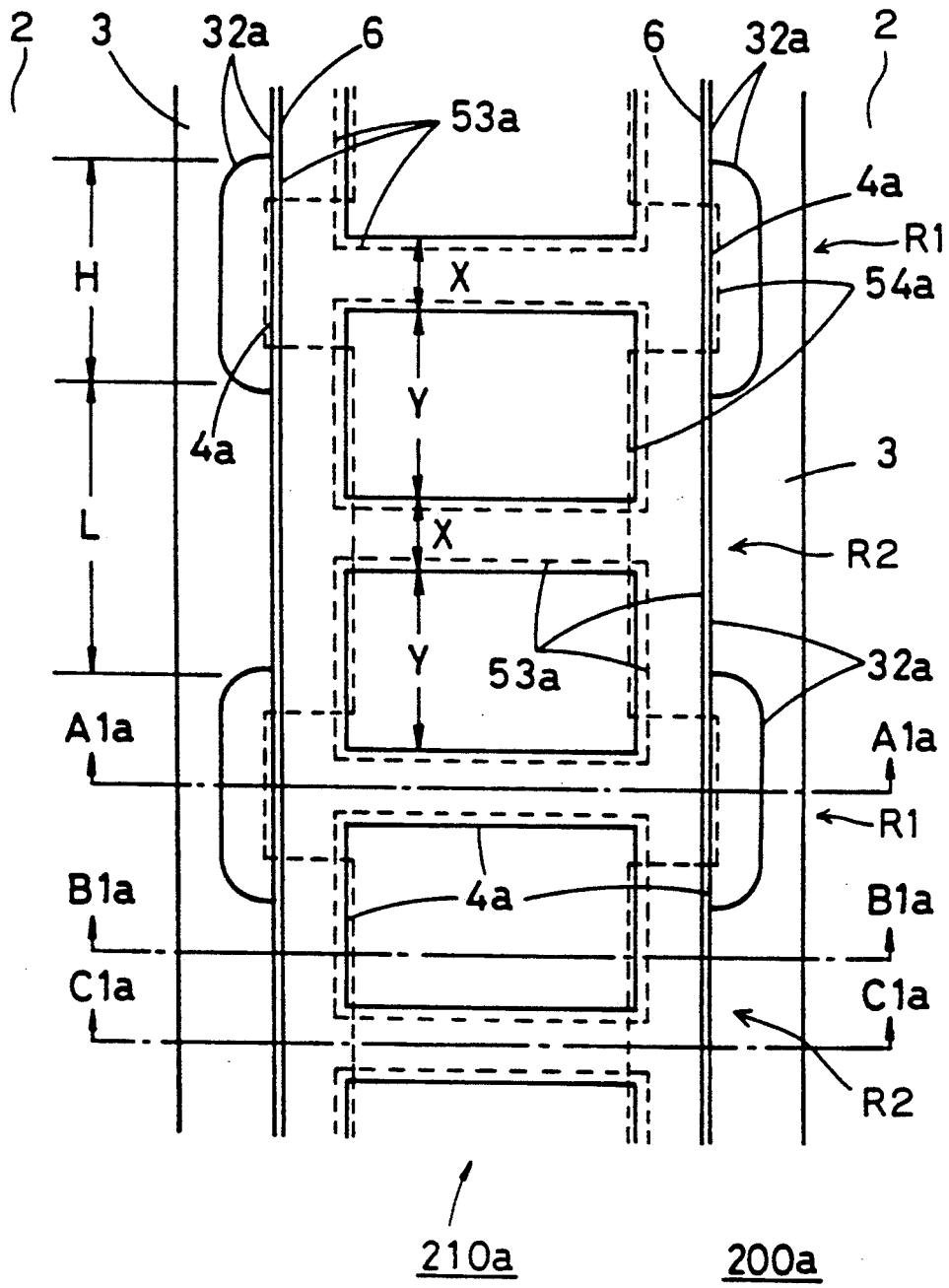
FIG. 4 is a plan view of a variation of the N-channel IGBT according to the first preferred embodiment of to the present invention.

FIG. 4 schematically shows the pattern of the p-type base region 3 and n-type emitter regions 4 on the top major surface of the semiconductor body 220 where the pattern is made fine. A multiplicity of IGBT unit cells 210a shown in FIG. 4 are connected in parallel to form an IGBT 200a as well as the IGBT unit cells 210 of FIG. 1. There are shown in FIG. 4 an n-type emitter region 4a, a high-concentration p-type semiconductor region 32a, a mask pattern 53a, and a mask pattern 54a, which correspond to the n-type emitter regions 4, the high-concentration p-type semiconductor region 32, the mask pattern 53, and the mask pattern 54 of the IGBT unit cell 210, respectively. In the IGBT unit cell 210a, the two beltlike or strip portions of the n-type emitter region 4a are linked together not only in first regions R1 in which the high-concentration p-type semiconductor region 32a is wide but also part of the second regions R2.

Figure 5:
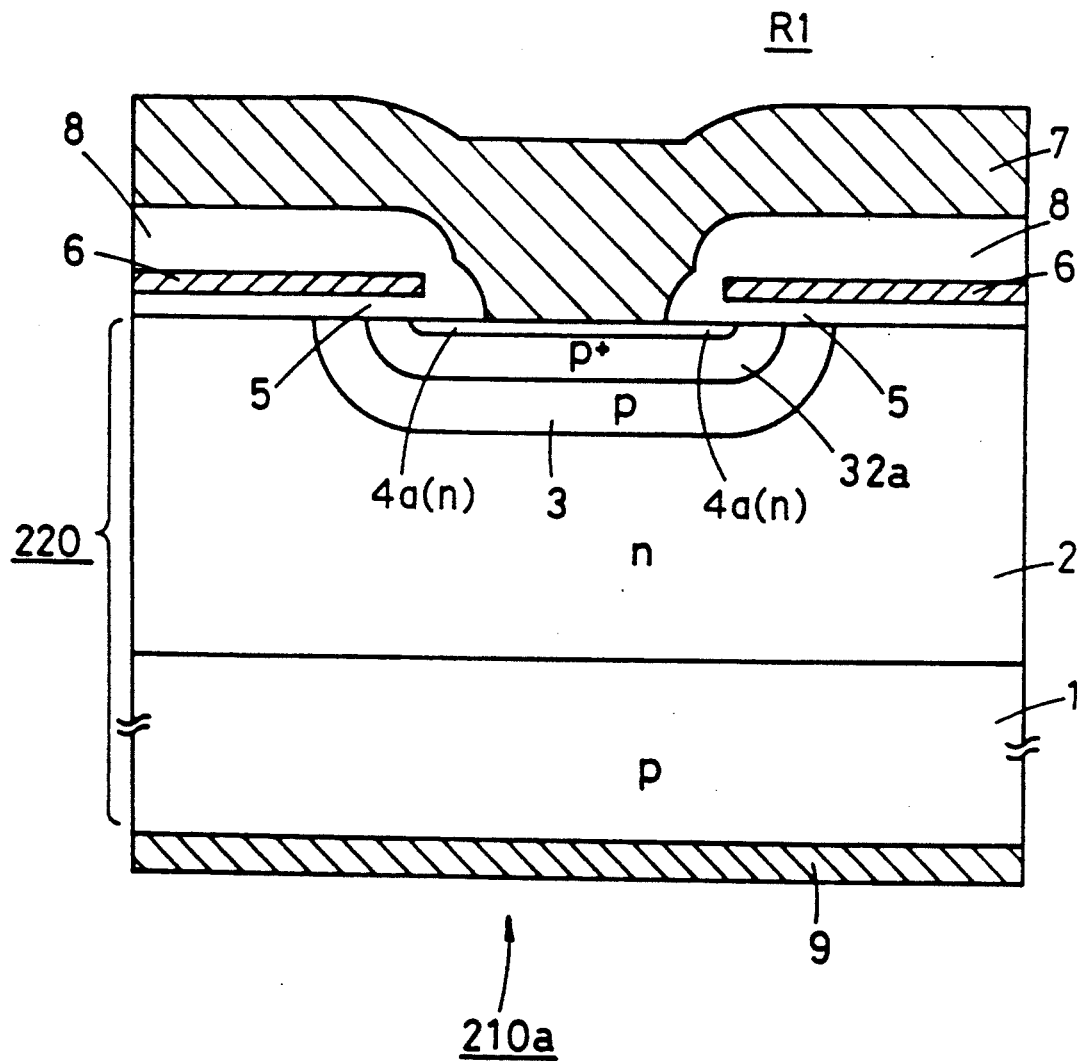
FIG. 5 is a cross-sectional view taken along the line A1a—A1a of FIG. 4.
Figure 6:
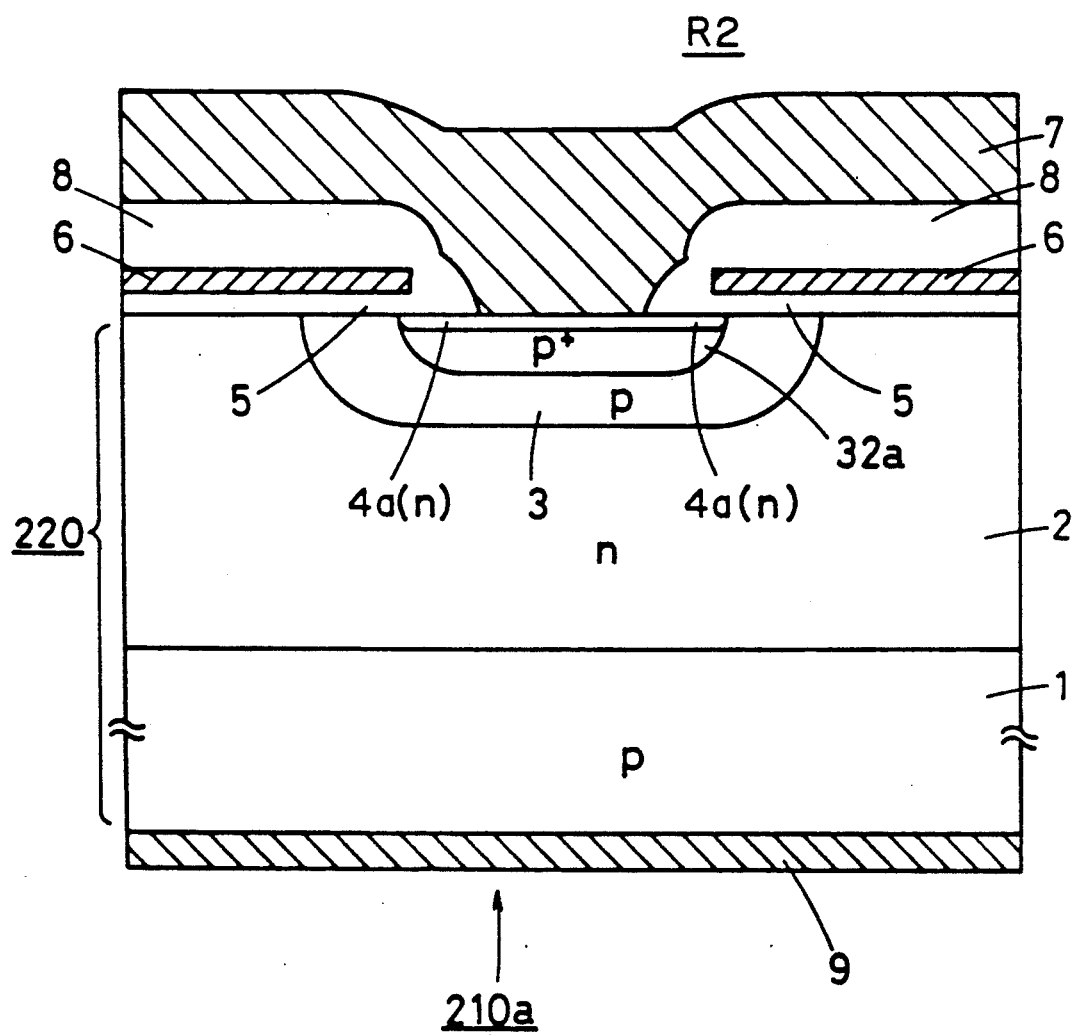
FIG. 6 is a cross-sectional view taken along the line C1a—C1a of FIG. 4.

FIGS. 5 and 6 are cross-sectional views taken along the lines A1a—A1a and C1a—C1a of FIG. 4, respectively. The cross-sectional structures of FIGS. 5 and 6 are identical with those of FIGS. 2 and 3 except that the n-type emitter region 4a is not divided into two regions. The cross-section taken along the line B1a—B1a of FIG. 4 is identical with that of FIG. 3.

We introduce an emitter bypass ratio e generally defined as the ratio of the area A1 of the n-type emitter region 4 electrically contacting the emitter electrode 7 to the sum of the area A1 and the area A2 of the high-concentration p-type semiconductor region 32 in contact with the emitter electrode 7. Thus, the emitter bypass ratio e is given by a formula:

$$e = \frac{A1}{A1 + A2} \quad (4)$$

In the n-type emitter pattern of FIG. 4, a width X is the width of the n-type emitter region 4a, and a width Y is the width of a region other than the n-type emitter region 4a or part of the high-concentration p-type semiconductor region 32a which is exposed at the top major surface of the semiconductor body 220. In this IGBT 200a having the particular n-type emitter pattern shown in FIG. 4, the emitter bypass ratio e is simultaneously expressed by another formula:

$$e = \frac{X}{X + Y} \quad (4a)$$

Formula (4) provides the general definition of the emitter bypass ratio e, whereas Formula (4a) gives the specific one for IGBT 200a.

On the top major surface of the semiconductor body 220 of FIG. 4, a length H is the length of a portion in which the high-concentration p-type semiconductor region 32a lies between the n-type emitter region 4a and the n-type epitaxial layer 2, and a length L is the length of a portion in which the n-type emitter region 4a and n-type epitaxial layer 2 are isolated from each other only by the p-type base region 3 without the high-concentration p-type semiconductor region 32a. A high gate threshold voltage region percentage g is defined using the lengths H and L as:

$$g = \frac{H}{(H + L)} \quad (5)$$

The lengths H and L are the n-type channel widths having the relatively high gate threshold voltage $V_{GE}$(th-High) and the relatively low gate threshold voltage $V_{GE}$(th-Low), respectively. As the emitter bypass ration e increases and, equivalently, the area of the n-type emitter region 4a increases, the sheet resistance of the n-type emitter region 4a decreases. This is equivalent to decrease in source resistances connected equivalently in series in the MOSFET region, which is a factor of increase in electronic current in the MOSFET region. This enables the short-circuit current of the IGBT to increase. As a result, the short-circuit tolerance is reduced.

Figure 7:
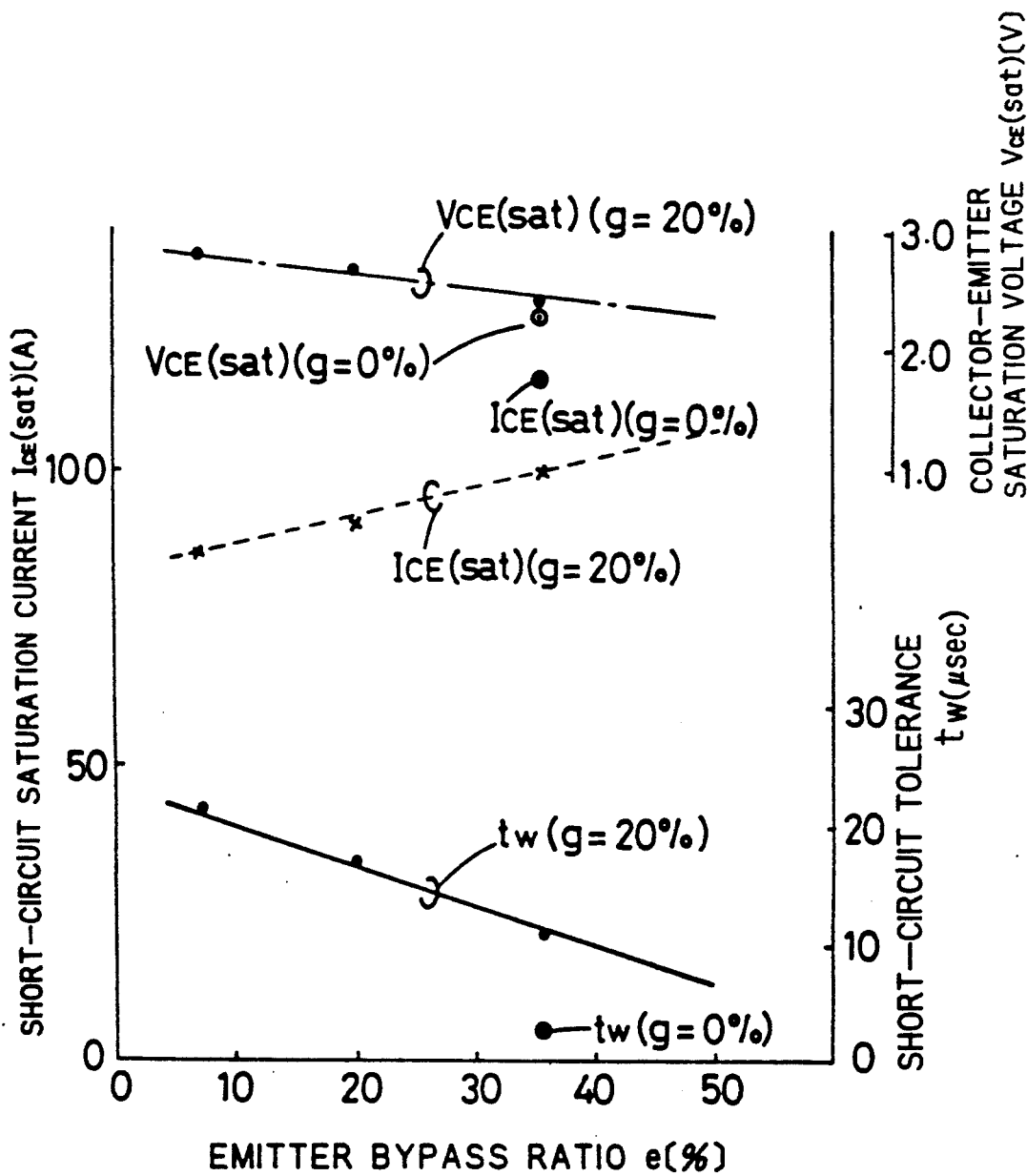
FIG. 7 is a graph showing the result of measurements of the IGBT of FIGS. 4 to 6.

FIG. 7 is a graph showing measurements of the collector-emitter saturation voltage $V_{CE}$(sat), saturation current $I_{CE}$(sat) and short-circuit tolerance $t_w$ with respect to the emitter bypass ratio e. The values plotted in the form of curves are the result of measurement where the high gate threshold voltage region percentage g is 20%. In the graph of FIG. 7, there are also shown values measured where the emitter bypass ratio e is 36% and the high gate threshold voltage region percentage g is 0%. The short-circuit tolerance $t_w$ is defined as the time interval from the beginning of the short-circuit of the output of the IGBT to the breakdown of the IGBT.

Comparison is made between the measurement where e=36% and g=0% and the measurement where e=36% and g=20%. It is understood from the comparison that the provision of the high-concentration p-type semiconductor region 32a makes little difference in the collector-emitter saturation voltage $V_{CE}$(sat) but largely suppresses the saturation current $I_{CE}$(sat) when the device is short-circuited, accompanied by a large improvement in the short-circuit tolerance $t_w$. This fact supports the foregoing qualitative analysis.

The short-circuit tolerance $t_w$ required when the IGBT is used for an inverter device is about 10 $\mu$sec or more. The short-circuit tolerance $t_w$ required for an IGBT including a circuit for detecting a short-circuit current flowing when it is short-circuited to execute shot-circuit protection is about 5 $\mu$sec or more. For satisfying such short-circuit tolerance, it is necessary that the emitter bypass ratio e is 50% or less and the high gate threshold voltage region percentage g is 20% or more as may be found from the measurements of FIG. 7.

For convenience of measurement, the measurements have been performed only for the IGBT 200a shown in FIGS. 4 to 6. However, the same results of the measurements are sufficiently expected also for the IGBT 200 as the emitter bypass ratio e of IGBT 200 is defined by the general Formula (4).

1-4. Process Steps for Fabrication of Device

FIGS. 8 to 21 are front sectional views of the IGBT unit cell 210 in respective process steps for fabrication of the IGBT 200. Referring to FIGS. 8 to 21, the process steps of the first preferred embodiment will be described hereinafter.

Figure 8:
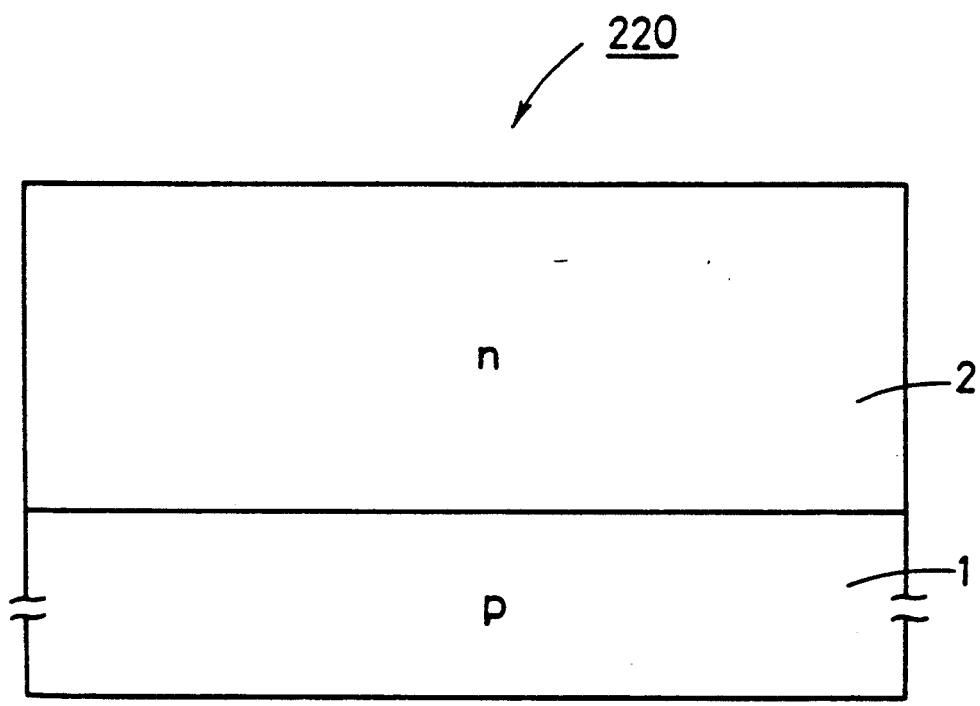

Initially provided as a p-type silicon substrate SB corresponding to the p-type collector layer 1 (FIG. 8). The n-type epitaxial layer 2 is formed on the p-type collector layer 1 by epitaxial growth technique. The p-type collector layer 1 and n-type epitaxial layer 2 form the semiconductor body 220. The illustration of the structure underlying the n-type epitaxial layer 2 will be omitted in FIGS. 9 to 19 and 21.

In the step of FIG. 9, a silicon oxide film 71 is formed on the n-type epitaxial layer 2, i.e., on the top major surface of the semiconductor body 220.

Figure 10:
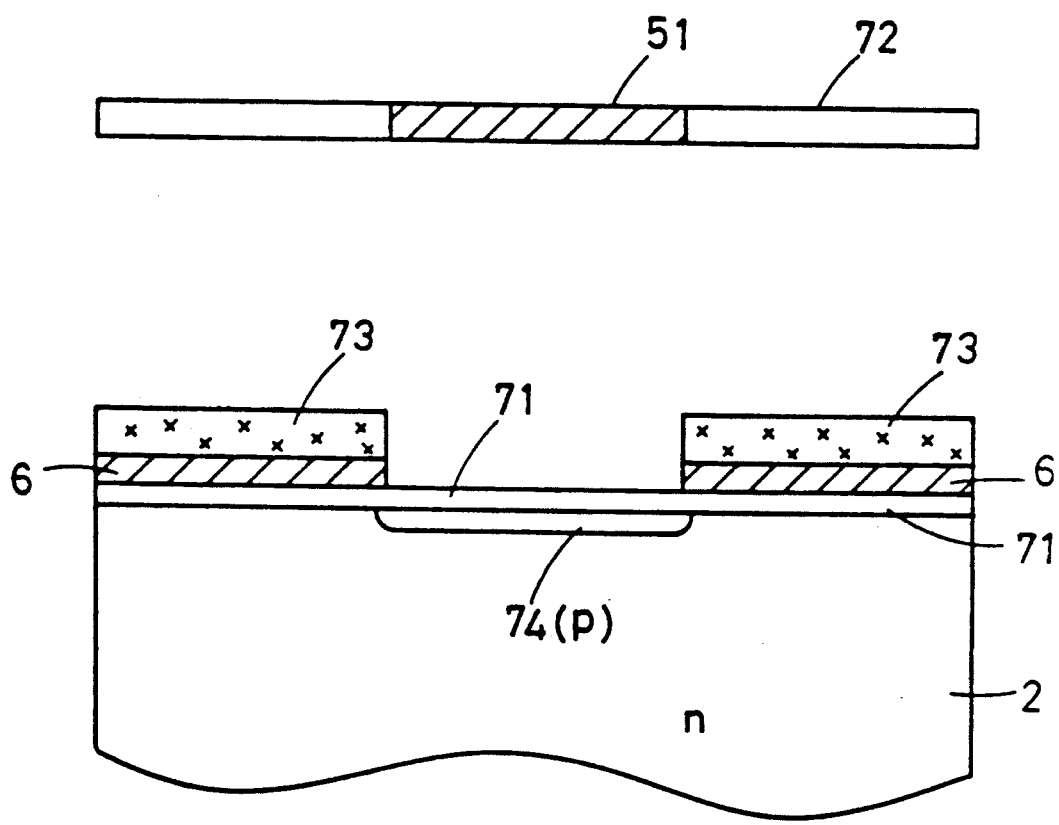

Polysilicon is formed over the silicon oxide film 71, and a resist layer is in turn formed over the polysilicon. Photolithography process is carried out on the resist layer using a mask 72 having a pattern corresponding to the mask pattern 51 of FIG. 1 to provide a resist pattern 73 corresponding to the mask pattern 51. The polysilicon is selectively etched using the resist pattern 73 as a mask to form the gate electrode 6 on the silicon oxide film 71. The n-type epitaxial layer 2 is selectively implanted with boron using the resist pattern 73 and gate electrode 6 as a mask to provide a p-type semiconductor region 74 (FIG. 10).

Figure 11:
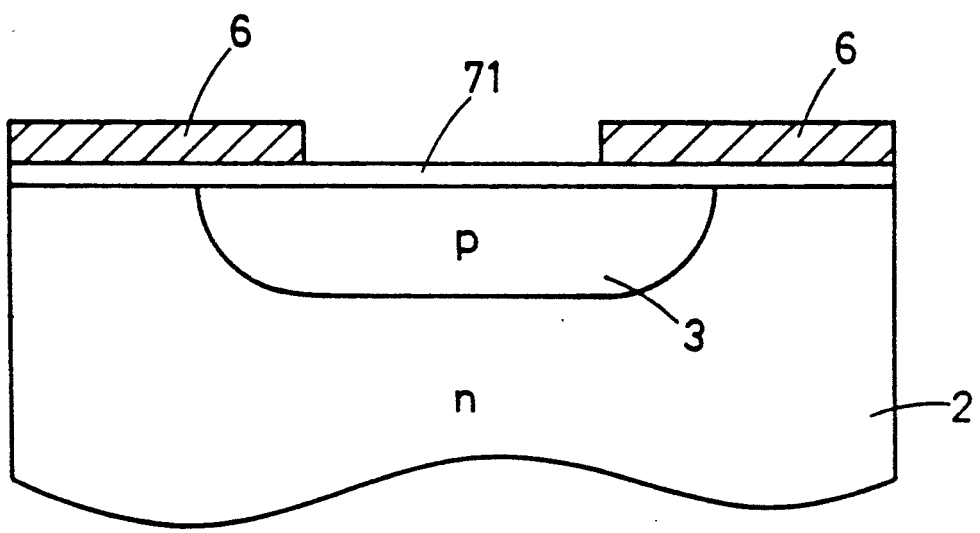

The resist pattern 73 is removed, and the boron in the p-type semiconductor region 74 is diffused into part of the n-type epitaxial layer 2 which underlies the gate electrode 6 by drive-in process to provide the p-type base region 3 as shown in FIG. 11.

Figure 12:
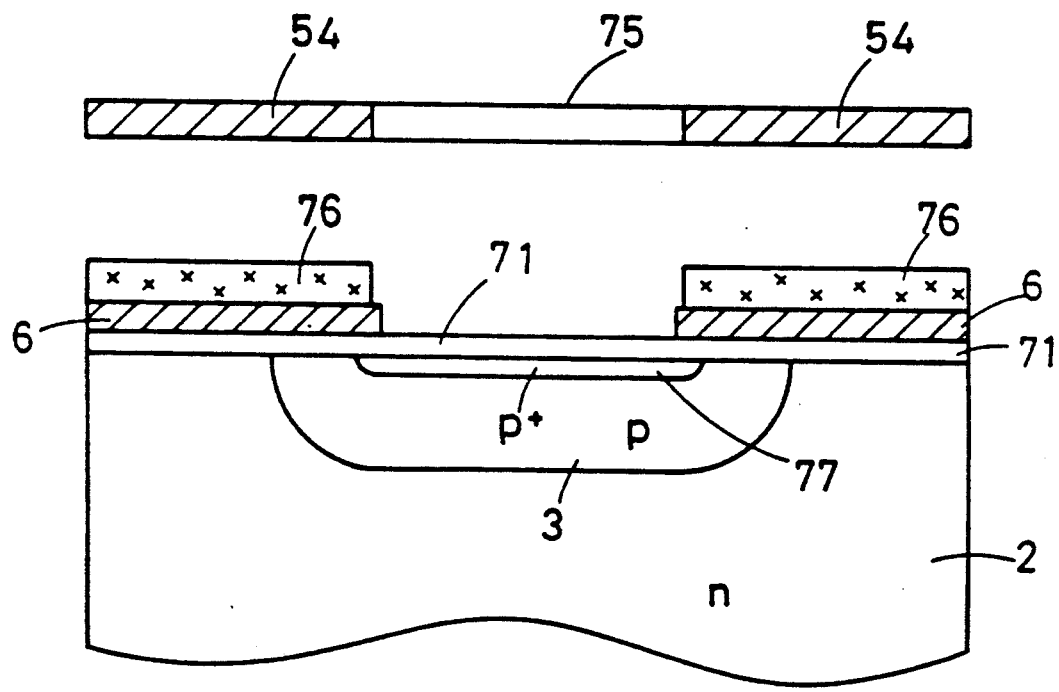
Figure 13:
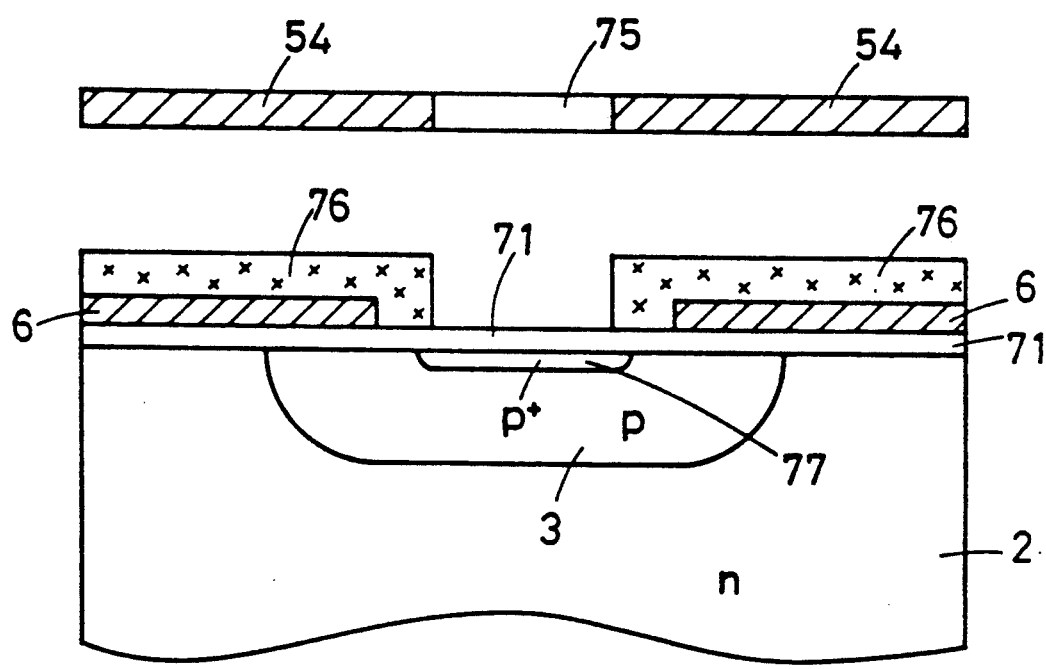

In the process step of FIG. 12 (a cross-section taken along the line A1—A1 of FIG. 1) and FIG. 13 (a cross-section taken along the line B1—B1 of FIG. 1), a resist layer is provided over the gate electrode 6 and silicon oxide film 71. Photolithography process is carried out on the resist layer using a mask 75 having a pattern corresponding to the mask pattern 54 of FIG. 1 to provide a resist pattern 76 corresponding to the mask pattern 54. The p-type base region 3 is selectively implanted with boron with relatively high concentration using the resist pattern 76 and gate electrode 6 as a mask to provide a high-concentration p-type semiconductor region 77.

Figure 14:
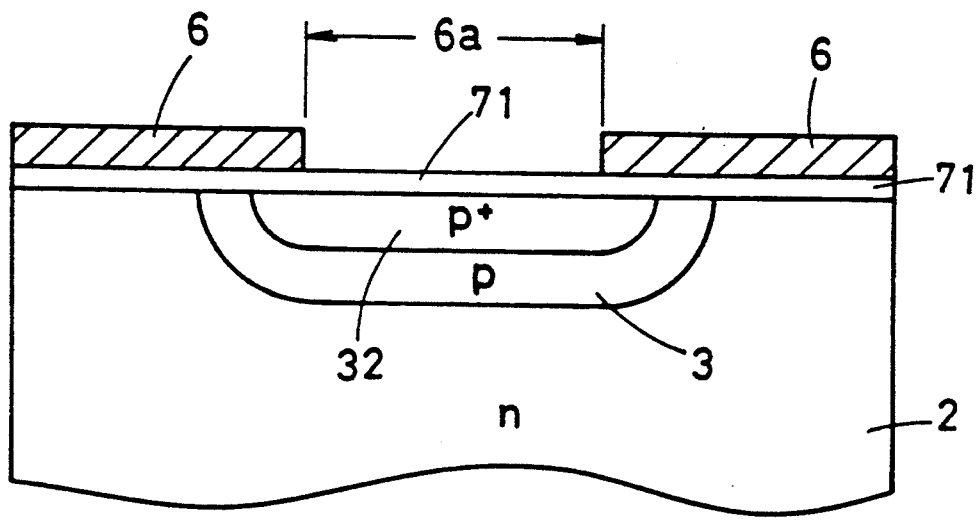
Figure 15:
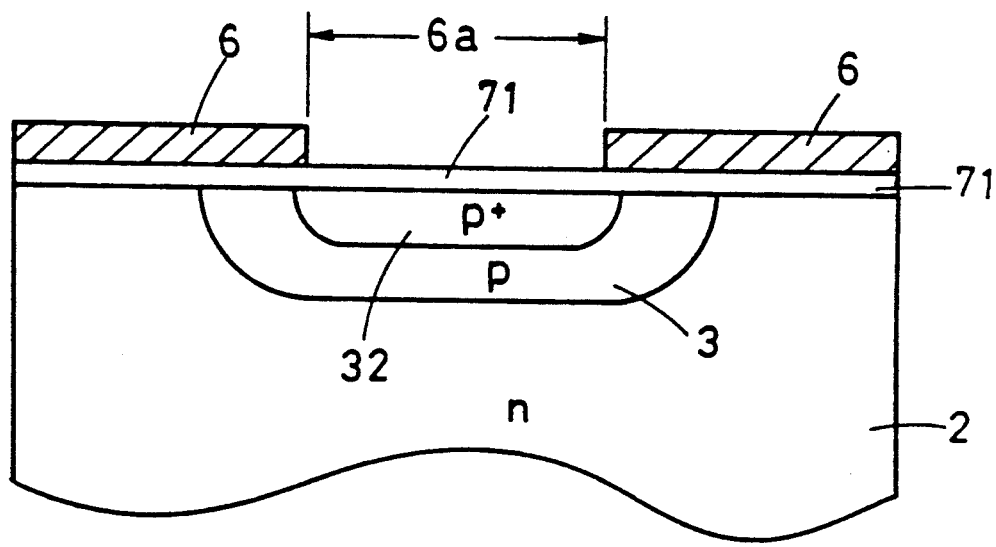

The resist pattern 76 is removed, and the boron in the high-concentration p-type semiconductor region 77 is diffused by drive-in process to provide the high-concentration p-type semiconductor region 32 as shown in FIG. 14 (a cross-section taken along the line A1—A1 of FIG. 1) and FIG. 15 (a cross-section taken along the line B1—B1 of FIG. 1). Since the mask pattern 54 used in the step of FIGS. 12 and 13 is shaped so that it is wide around the line A1—A1 of FIG. 1 and narrow around the line B1—B1 of FIG. 1, the high-concentration p-type semiconductor region 32 extends to the part of the p-type base region 3 which underlies the gate electrode 6 around the line A1—A1 (FIG. 14) but is confined only to the inside of an opening 6a of the gate electrode 6 around the line B1—B1 (FIG. 15). The diffusion step of the high-concentration p-type semiconductor region 77 is carried out such that the high-concentration p-type semiconductor region 32 to be formed thereby does not reach the n-type epitaxial layer 2 over the p-type base region 3 around the line A1—A1.

Figure 16:
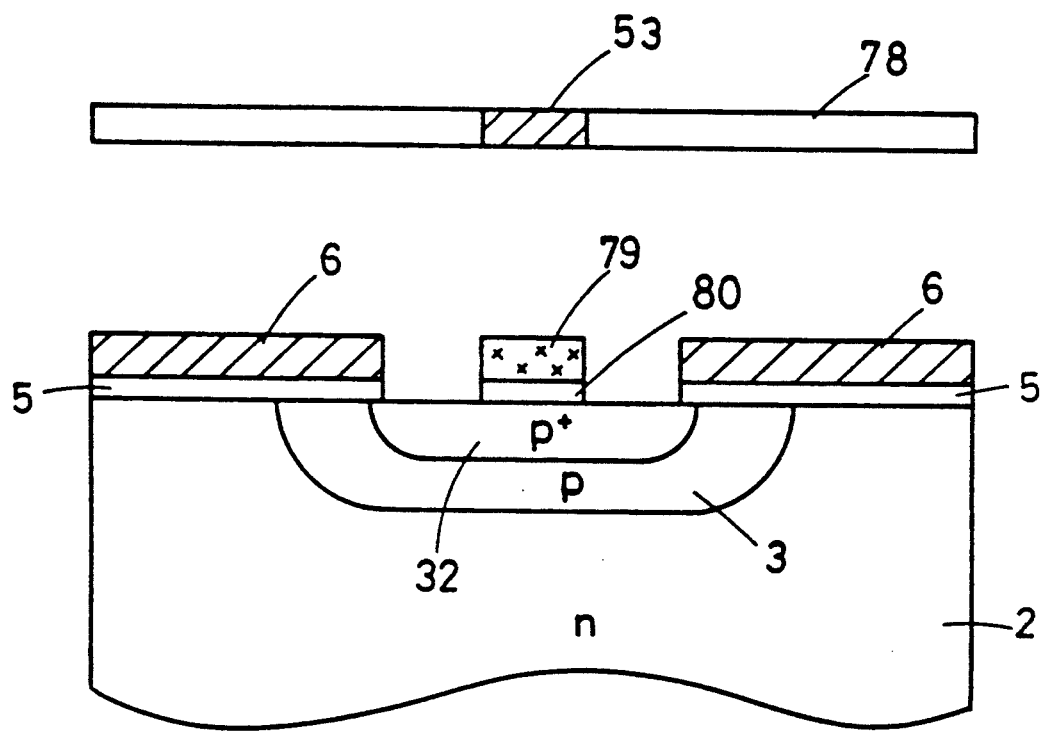
Figure 17:
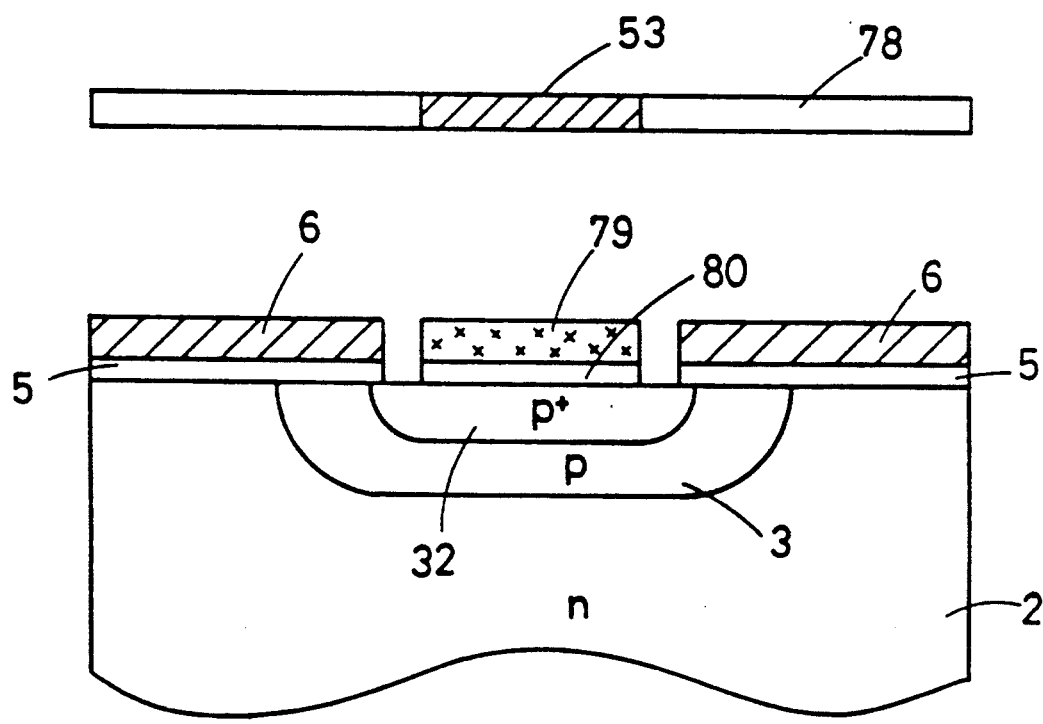

In the step of FIG. 16 (a cross-section taken along the line A1—A1 of FIG. 1) and FIG. 17 (a cross-section taken along the line B1—B1 of FIG. 1), a resist layer is provided over the gate electrode 6 and silicon oxide film 71. The resist layer is patterned by photolithography using a mask 78 having a pattern corresponding to the mask pattern 53 to provide a resist pattern 79. The silicon oxide film 71 is selectively etched using the resist pattern 79 and gate electrode 6 as a mask to form the gate insulating film 5 and an oxide film pattern 80.

Figure 18:
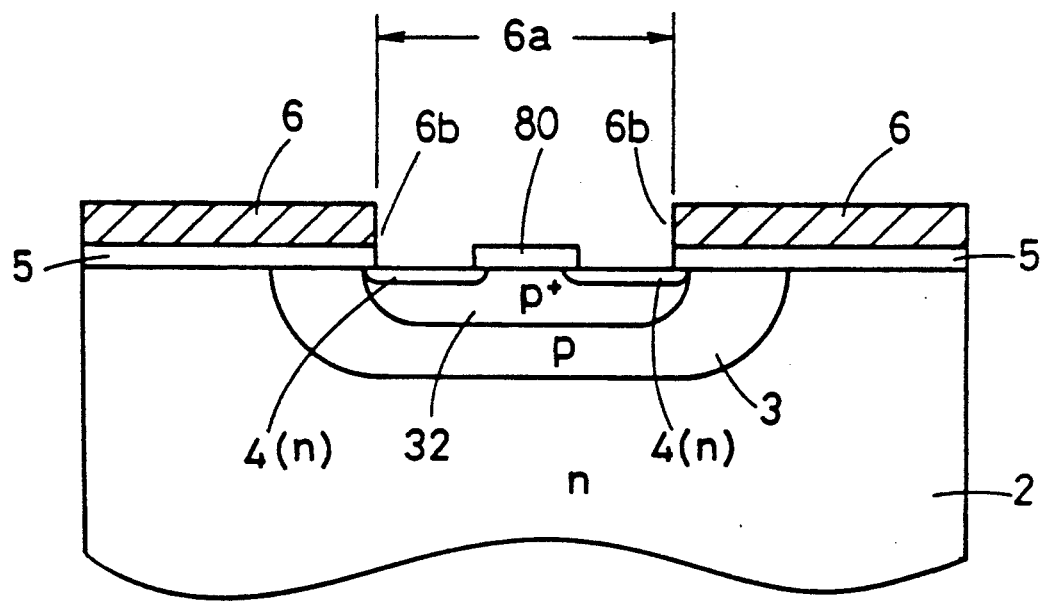
Figure 19:
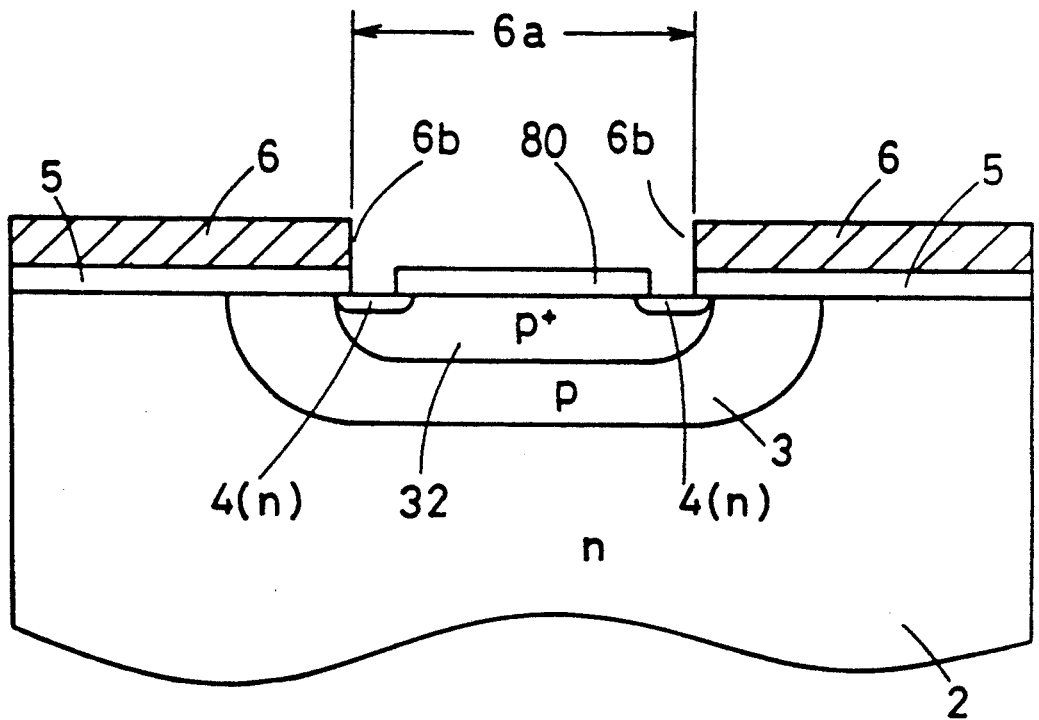

As shown in FIG. 18 (a cross-section taken along the line A1—A1 of FIG. 1) and FIG. 19 (a cross-section taken along the line B1—B1 of FIG. 1), the resist pattern 79 is removed, and the high-concentration p-type semiconductor region 32 in its top surface portion is selectively implanted with arsenic using the oxide film pattern 80, gate insulating film 5 and gate electrode 6 as a mask. This permits the n-type emitter regions 4 to be formed in the top major surface of the high-concentration p-type semiconductor region 32. Since the mask pattern 53 used in the step of FIGS. 16 and 17 is shaped so that it is wide around the line A1—A1 of FIG. 1 and narrow around the line B1—B1 of FIG. 1, the n-type emitter regions 4 extends wider on the inside of the opening 6a of the gate electrode 6 around the line A1—A1 (FIG. 18) but is confined only to the inside of the opening 6a of the gate electrode 6 adjacent an opening end 6b of the gate electrode 6 around the line B1—B1 (FIG. 19).

Figure 20:
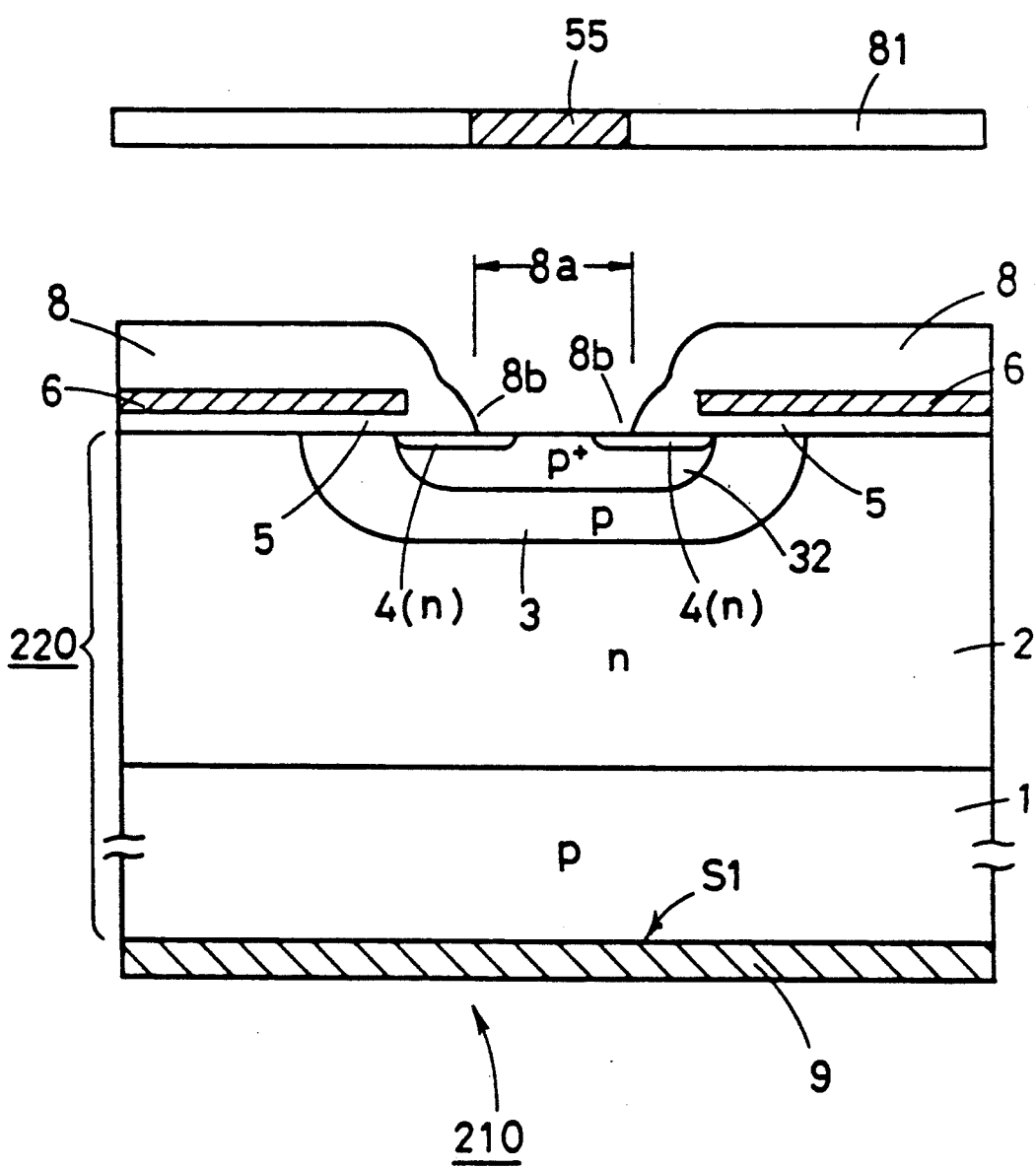
Figure 21:
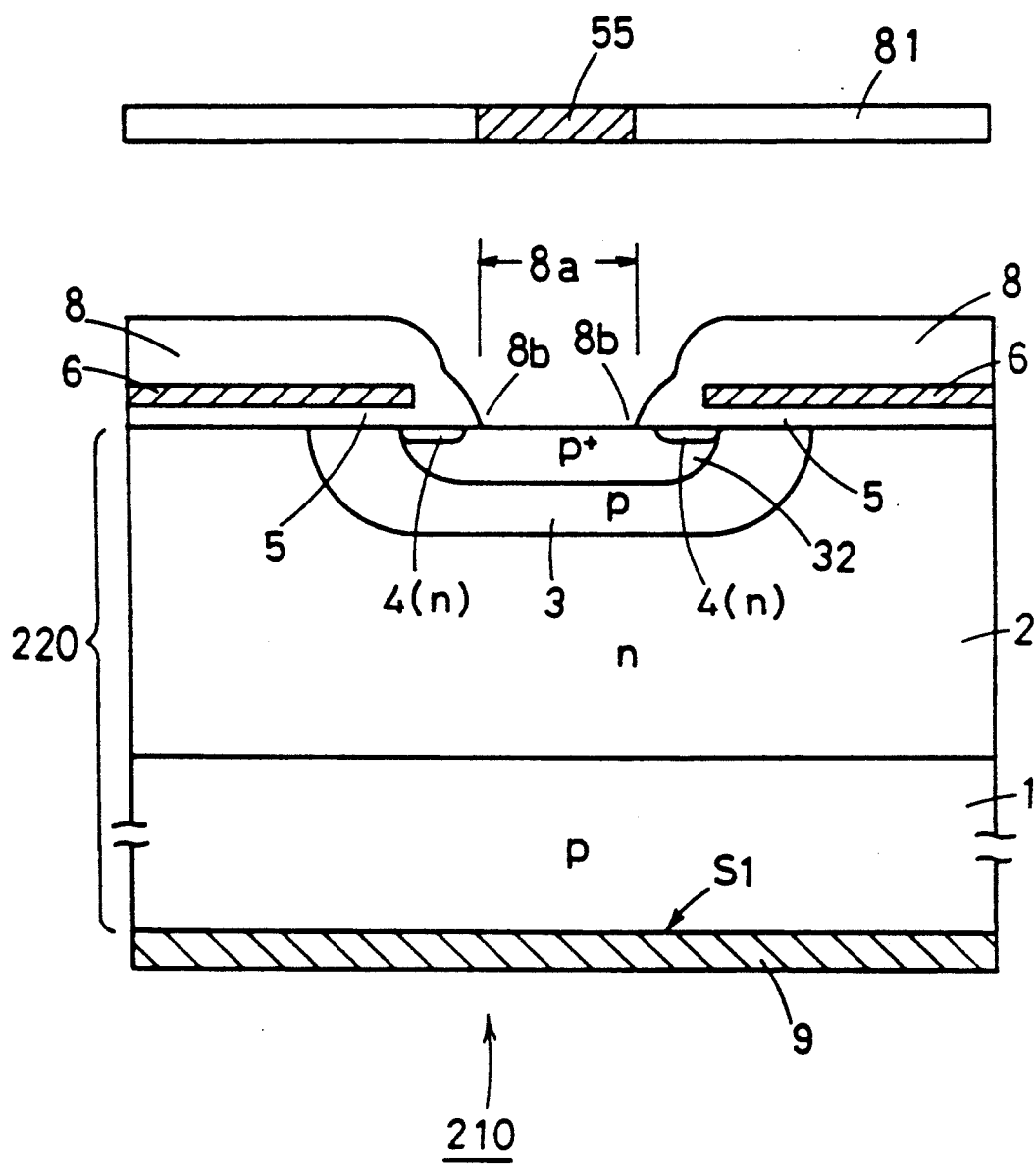

In the step of FIG. 20 (a cross-section taken along the line A1—A1 of FIG. 1) and FIG. 21 (a cross-section taken along the line B1—B1 of FIG. 1), a relatively thick silicon oxide film is provided over the structure hereinabove obtained. The silicon oxide film is selectively etched off using a mask 81 having a pattern corresponding to the mask pattern 55 to form the oxide film 8 having an opening 8a. An opening end 8b of the oxide film 8 is located above the n-type emitter regions 4 around the line A1—A1 (FIG. 20) but above the high-concentration p-type semiconductor region 32 around the line B1—B1 (FIG. 21).

An aluminum film is formed over the structure hereinabove obtained to form the emitter electrode 7 shown in FIGS. 2 and 3. Part of the emitter electrode 7 which lies inside the opening 8a electrically short-circuits the p-type base region 3 and n-type emitter regions 4. Then, a Ti-Ni-Au film is formed over a bottom major surface S1 of the semiconductor body 220 to form the collector electrode 9 shown in FIGS. 2 and 3.

2. Second Preferred Embodiment 2-1. Structure of Device

Figure 22:
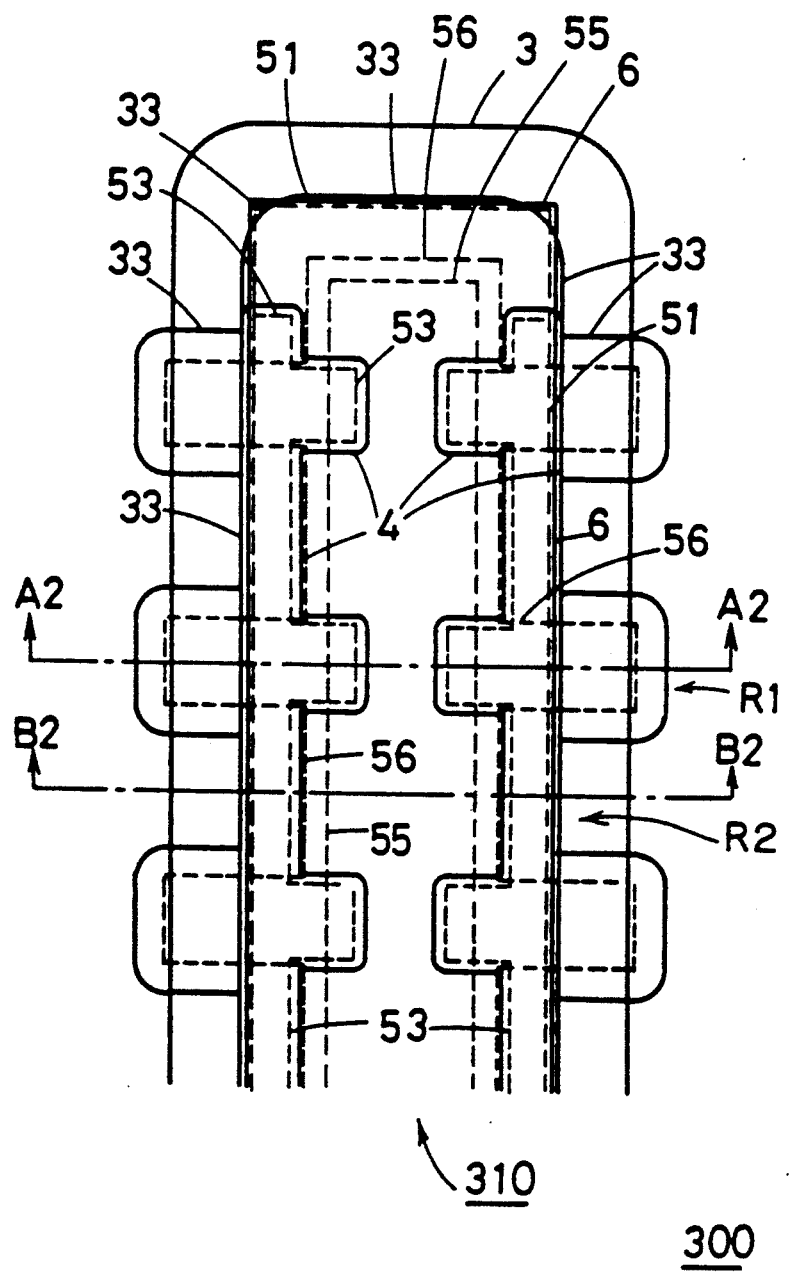
FIG. 22 is a plan view of an N-channel IGBT according to a second preferred embodiment of to the present invention.
Figure 23:
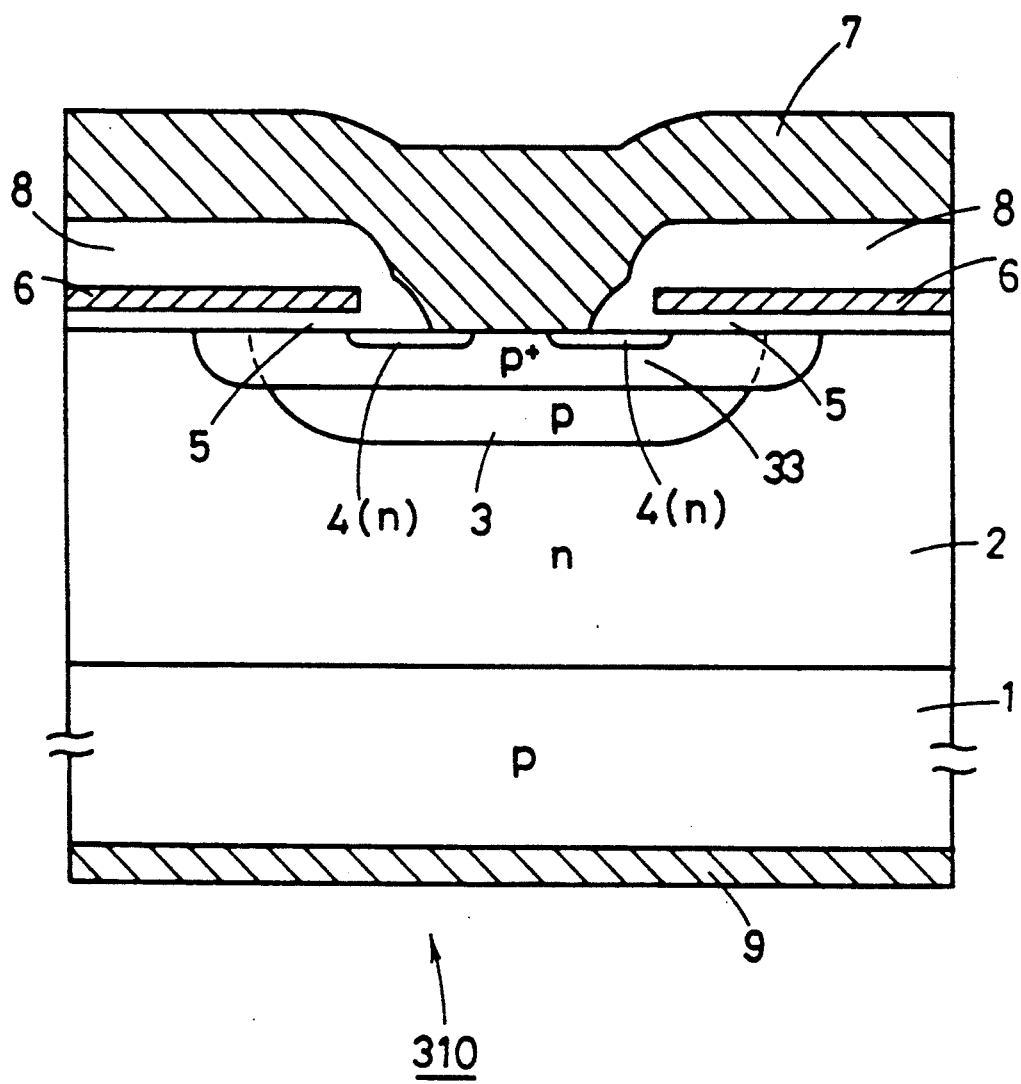
FIG. 23 is a cross-sectional view taken along the line A2—A2 of FIG. 18.

FIG. 22 is a plan view of an N-channel IGBT 300 according to a second preferred embodiment of the present invention. The IGBT 300 comprises a multiplicity of IGBT unit cells 310 connected in parallel as well as the IGBT 200 of the first preferred embodiment. The emitter electrode 7 and oxide film 8 are not illustrated in FIG. 22. The dotted lines of FIG. 22 represent the configurations of various mask patterns to be used in the process steps for fabricating the IGBT 300. A mask pattern 56 is used for formation of a high-concentration p-type semiconductor region 33. FIG. 23 is a cross-sectional view of one of the IGBT unit cells 310 taken along the line A2—A2 of FIG. 22.

As shown in FIG. 22, the n-type emitter regions 4 are relatively wide as viewed from the top around the line A2—A2 as well as the line A1—A1 of the first preferred embodiment and relatively narrow as viewed from the top around the line B2—B2 as well as the line B1—B1 of the first preferred embodiment. In the IGBT unit cell 310, a high-concentration p-type semiconductor region 33 formed by diffusion of p-type impurities at high concentration in a pattern which surrounds the n-type emitter regions 4 extends over the p-type base region 3 into the n-type epitaxial layer 2 around the line A2—A2. Around the line B2—B2, the high-concentration p-type semiconductor region 33 is formed such that it does not extend to the outside of the n-type emitter regions 4 as well as the high-concentration p-type semiconductor region 32 of FIG. 3 or the high-concentration p-type semiconductor region 31 of FIG. 42. A cross-section taken along the line B2—B2 of FIG. 22 is provided by replacing the high-concentration p-type semiconductor region 32 of FIG. 3 with the high-concentration p-type semiconductor region 33, and the illustration thereof will be omitted herein.

2-2. Characteristic of Device

In the IGBT 300 of the second preferred embodiment, the n-type channels to be formed between the n-type emitter regions 4 and n-type epitaxial layer 2 around the line A2—A2 have a high gate threshold voltage $V_{GE}(th)$ by the influence of the high-concentration p-type semiconductor region 33 and a long channel length L. The channel length of the n-type channels formed by the inverted layer of the second preferred embodiment is longer than that of the n-type channels formed by the inverted layer of the high-concentration p-type semiconductor region 32 of the IGBT 200 around the line A1—A1 of the first preferred embodiment. Hence the device of the second preferred embodiment is advantageously more effective for reduction in saturation current $I_{CE}(sat)$ than the device of the first preferred embodiment.

2-3. Process Steps for Fabrication of Device

Figure 24:
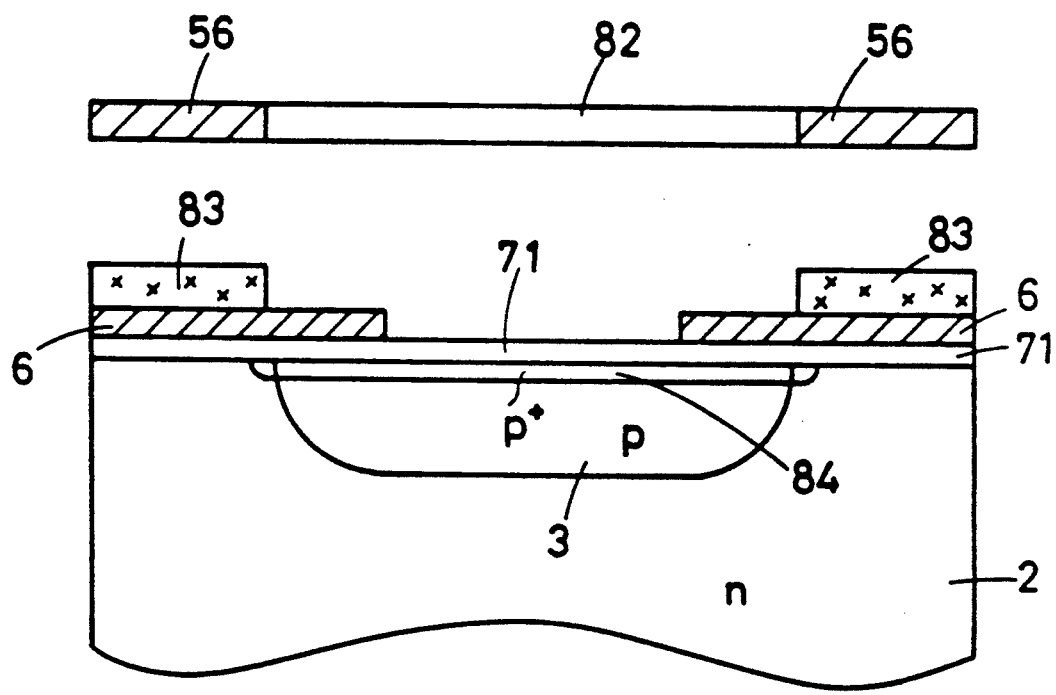
FIGS. 24 and 25 are cross-sectional views showing process steps for fabrication of the IGBT of FIG. 18.
Figure 25:
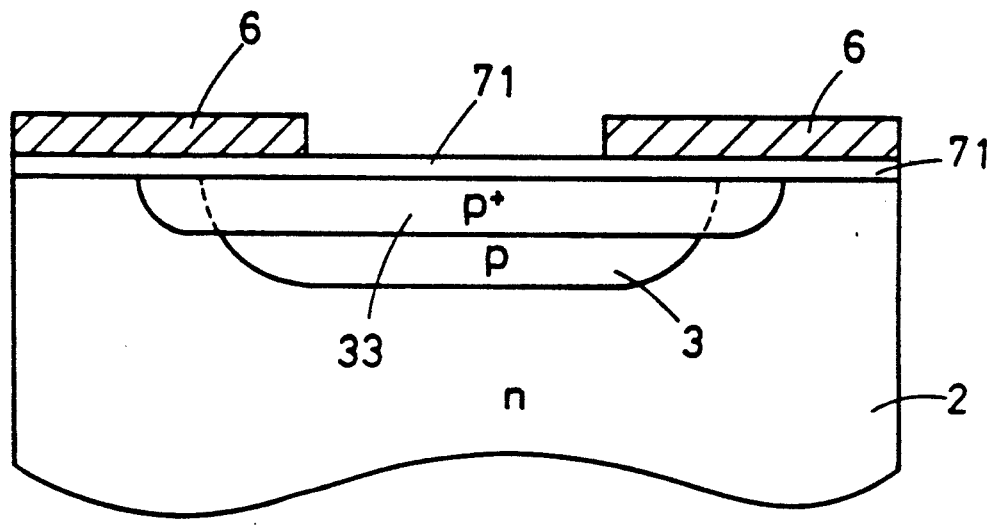

FIGS. 24 and 25 are cross-sectional views of the IGBT unit cell 310 taken along the line A2—A2 of FIG. 22 in process steps for fabrication of the IGBT 300. Referring to FIGS. 24 and 25, description will be given on the process steps for fabricating the IGBT 300 of the second preferred embodiment.

The same process steps as those of FIGS. 8 to 11 for the IGBT 200 are carried out. Then the process proceeds to the step of FIG. 24. A resist layer is formed over the gate electrode 6 and silicon oxide film 71. Photolithography process is carried out on the resist layer using a mask 82 having a pattern corresponding to the mask pattern 56 of FIG. 1 to provide a resist pattern 83 corresponding to the mask pattern 56. The p-type base region 3 and n-type epitaxial layer 2 are selectively implanted with boron with high energy with high concentration using the resist pattern 83 as a mask to provide a high-concentration p-type semiconductor region 84.

Then the process proceeds to the step of FIG. 25. The resist pattern 83 is removed, and the boron in the high-concentration p-type semiconductor region 84 is diffused by drive-in process to provide the high-concentration p-type semiconductor region 33. Since the mask pattern 56 used in the step of FIG. 24 is shaped so that it is wide around the line A2—A2 of FIG. 22 and narrow around the line B2—B2 of FIG. 22, the high-concentration p-type semiconductor region 33 extends to the part of the n-type epitaxial layer 2 which underlies the gate electrode 6 around the line A2—A2, but is confined only to the inside of the opening 6a of the gate electrode 6 around the line B2—B2 as well as the high-concentration p-type semiconductor region 32 of the first preferred embodiment shown in FIG. 15. The succeeding process steps are the same as the process steps of FIGS. 16 to 22 of the first preferred embodiment.

3. Third Preferred Embodiment 3-1. Structure of Device

Figure 26:
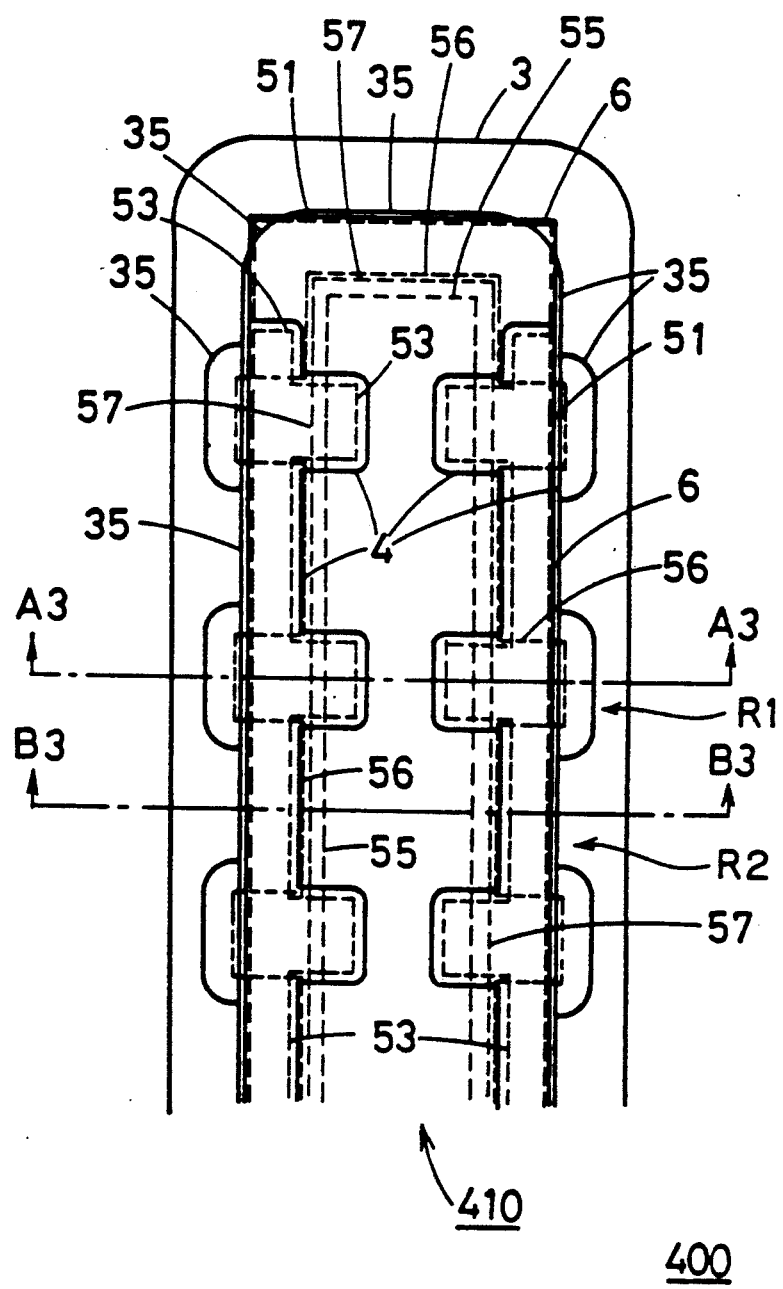
FIG. 26 is a plan view of an N-channel IGBT according to a third preferred embodiment of the present invention.
Figure 27:
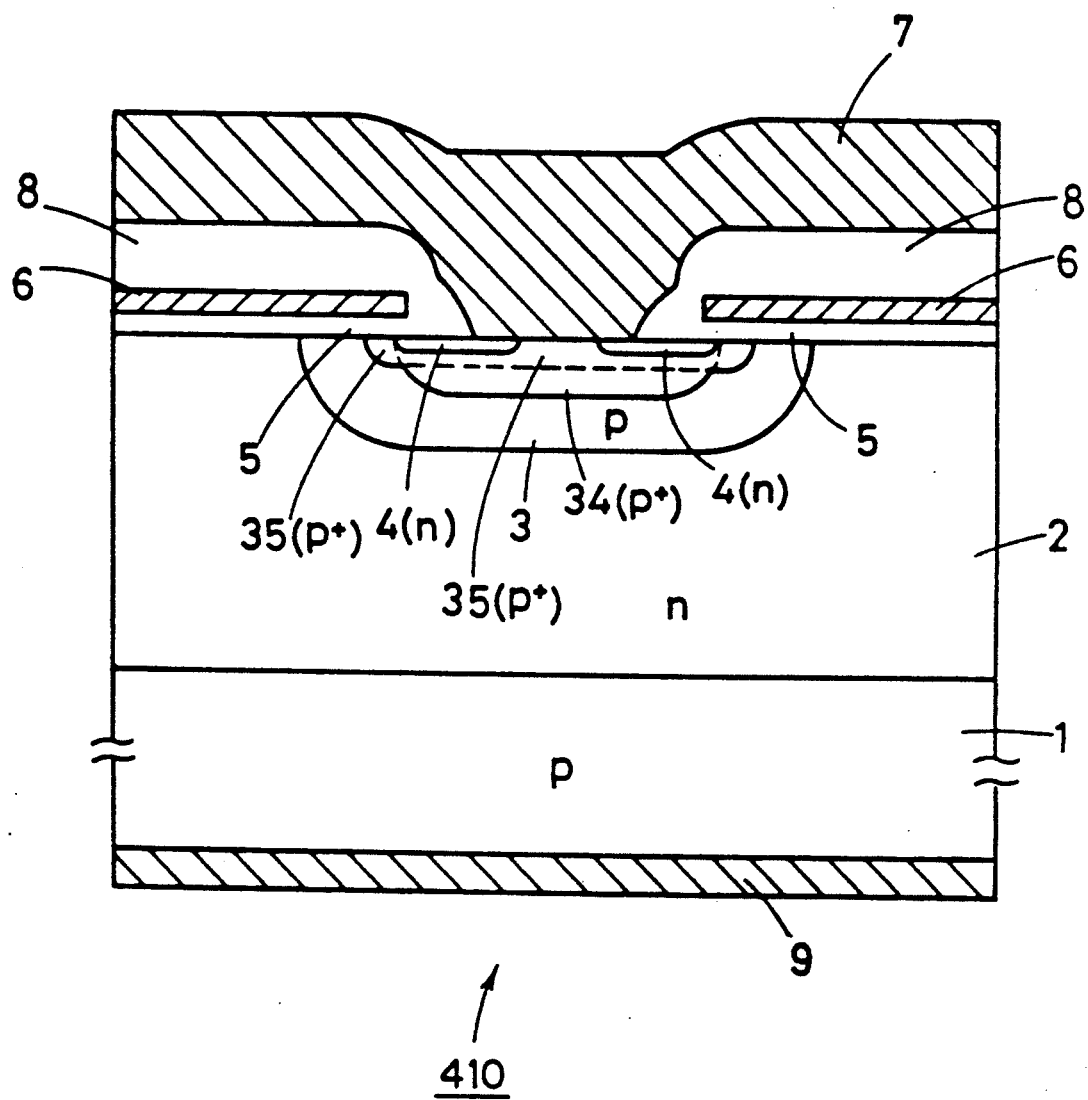
FIG. 27 is a cross-sectional view taken along the line A3—A3 of FIG. 26.
Figure 28:
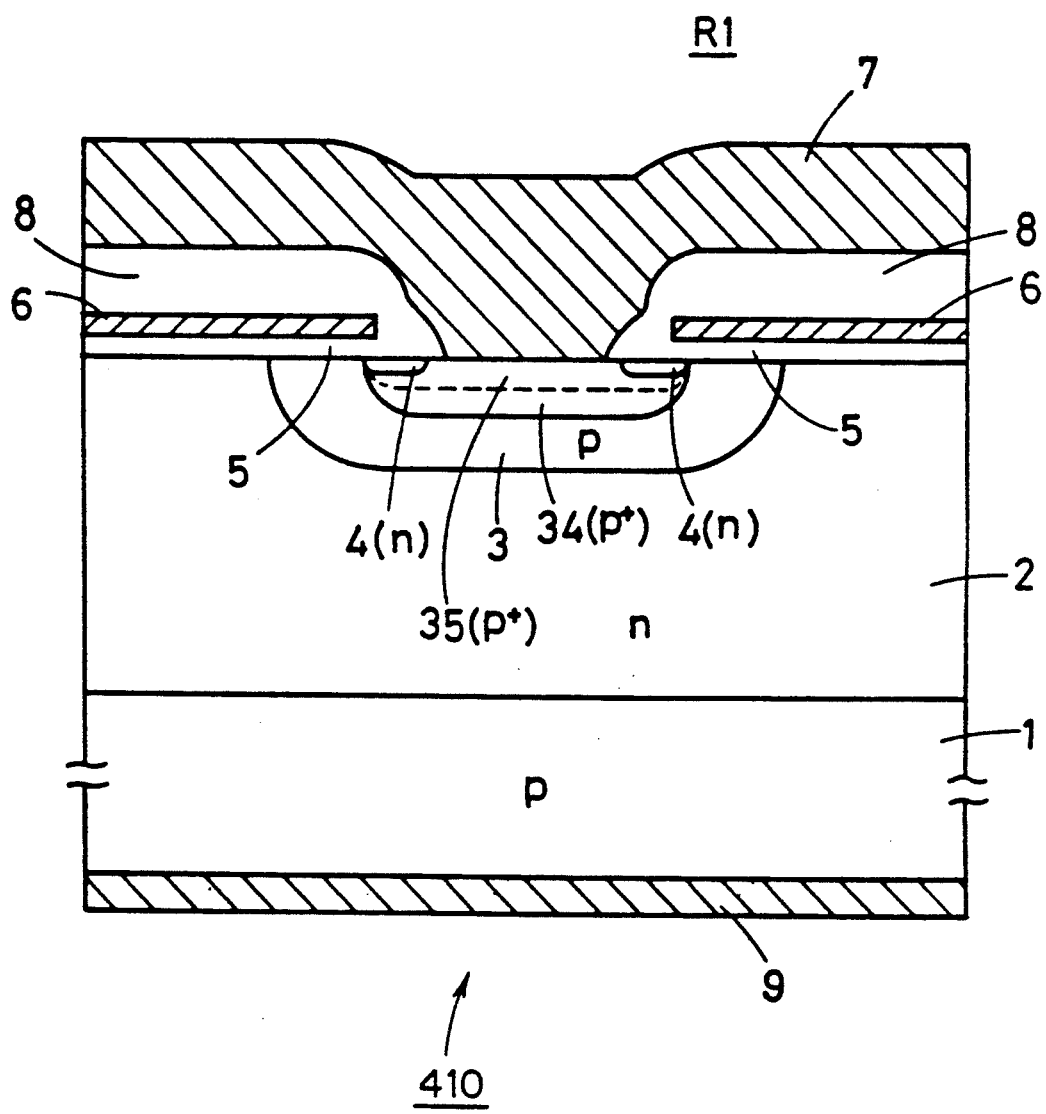
FIG. 28 is a cross-sectional view taken along the line B3—B3 of FIG. 26.
Figure 29:
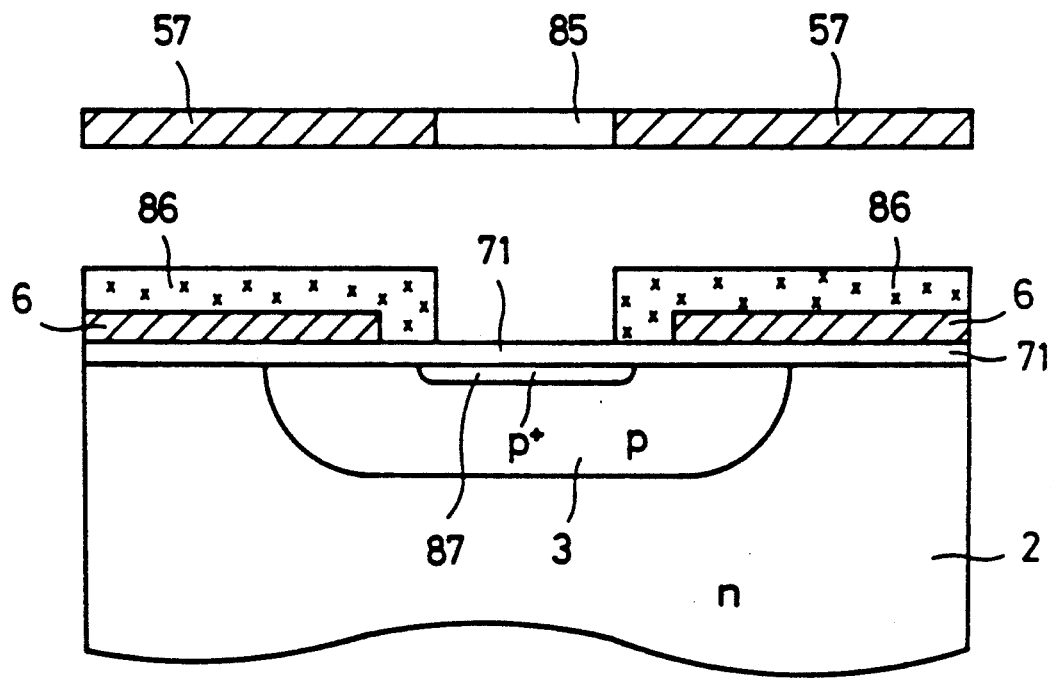
FIGS. 29 to 34 are cross-sectional views showing process steps for fabrication of the IGBT of FIG. 26.

FIG. 26 is a plan view of an N-channel IGBT 400 according to a third preferred embodiment of the present invention. The IGBT 400 comprises a multiplicity of IGBT unit cells 410 connected in parallel as well as the IGBT 200 of the first preferred embodiment shown in FIG. 1. The emitter electrode 7 and oxide film 8 are not illustrated in FIG. 26. The dotted lines of FIG. 26 represent the configurations of various mask patterns to be used in the process steps for fabricating the IGBT 400. A mask pattern 57 is used for formation of a high-concentration p-type semiconductor region 34. FIGS. 27 and 28 are cross-sectional views of one of the IGBT unit cells 410 taken along the lines A3—A3 and B3—B3 of FIG. 26, respectively.

Around the line A3—A3 as well as the line A1—A1 of the first preferred embodiment, the n-type emitter regions 4 are relatively wide as viewed from the top. Around the line B3—B3 as well as the line B1—B1 of the first preferred embodiment, the n-type emitter regions 4 are relatively narrow as viewed from the top.

In the devices of the first and second preferred embodiments, the high-concentration p-type semiconductor regions 32 and 33 to be formed for providing the n-type channels having the relatively high gate threshold voltage $V_{GE}(th\text{-High})$ are formed by diffusion also just under the n-type emitter regions 4 and have the function of suppressing the parasitic thyristor effect. In the IGBT 400 of the third preferred embodiment, a high-concentration p-type semiconductor region 35 for providing the n-type channels having the relatively high gate threshold voltage $V_{GE}(th\text{-High})$ is diffused shallowly as shown in FIGS. 27 and 28 independently of the high-concentration p-type semiconductor region 34 for suppressing the parasitic thyristor effect. As shown in FIG. 26, the configuration of the high-concentration p-type semiconductor region 35 as viewed from the top is similar to that of the high-concentration p-type semiconductor region 32 of the first preferred embodiment shown in FIG. 1. On the other hand, the high-concentration p-type semiconductor region 34 for suppressing the parasitic thyristor effect is formed by diffusion more deeply than the high-concentration p-type semiconductor region 35 just under the n-type emitter regions 4. As shown in FIGS. 27 and 28, the high-concentration p-type semiconductor region 34 is formed on the inside of the n-type emitter regions 4 so as not to affect the gate threshold voltage $V_{GE}(th)$ around the line A3—A3 as well as around the line B3—B3.

The higher concentration of the p-type impurity in the high-concentration p-type semiconductor region 34 brings the higher latch-up tolerance with both the collector-emitter saturation voltage $V_{CE}(sat)$ and the saturation current $I_{CE}(sat)$ unchanged. On the other hand, the excessively high concentration of the impurity in the high-concentration p-type semiconductor region 35 gives rise to such a high gate threshold voltage $V_{GE}(th)$ that the IGBT 400 can not turn on any more. Thus, there is an upper limit on the concentration of the impurity in the high-concentration p-type semiconductor region 35, whereas the concentration of the impurity is not restricted in the high-concentration p-type semiconductor region 34. It is, therefore, desirable that the concentration of the impurity is higher in the high-concentration p-type semiconductor region 34 than in the high-concentration p-type semiconductor region 35.

The high-concentration p-type semiconductor region 35 may be absent around the line B3—B3.

3-2. Characteristic of Device

Since the IGBT 400 of the third preferred embodiment is constructed as above described, the configuration and boron concentration of the high-concentration p-type semiconductor region 34 are optimized for suppression of the parasitic thyristor effect, while the configuration and boron concentration of the high-concentration p-type semiconductor region 35 are optimized for reduction in the saturation current $I_{CE}$(sat). Since the structures providing the optimization for the two purposes can be selected independently, the IGBT 400 is advantageously more effective for the respective purposes.

3-3. Process Steps for Fabrication of Device

FIGS. 29 to 34 are front sectional views of the IGBT unit cell 410 in process steps for fabrication of the IGBT 400. Referring to FIGS. 29 to 34, description will be given on the process steps for fabrication of the IGBT 400 of the third preferred embodiment.

The same process steps as those of FIGS. 8 to 11 for the IGBT 200 are carried out. Then the process proceeds to the step of FIG. 29 (a section taken along the lines A3—A3 and B3—B3). A resist layer is provided over the gate electrode 6 and silicon oxide film 71. Photolithography process is carried out on the resist layer using a mask 85 having a pattern corresponding to the mask pattern 57 of FIG. 26 to provide a resist pattern 86 corresponding to the mask pattern 57. The p-type base region 3 is selectively implanted with boron with high concentration using the resist pattern 86 as a mask to provide a high-concentration p-type semiconductor region 87.

Figure 30:
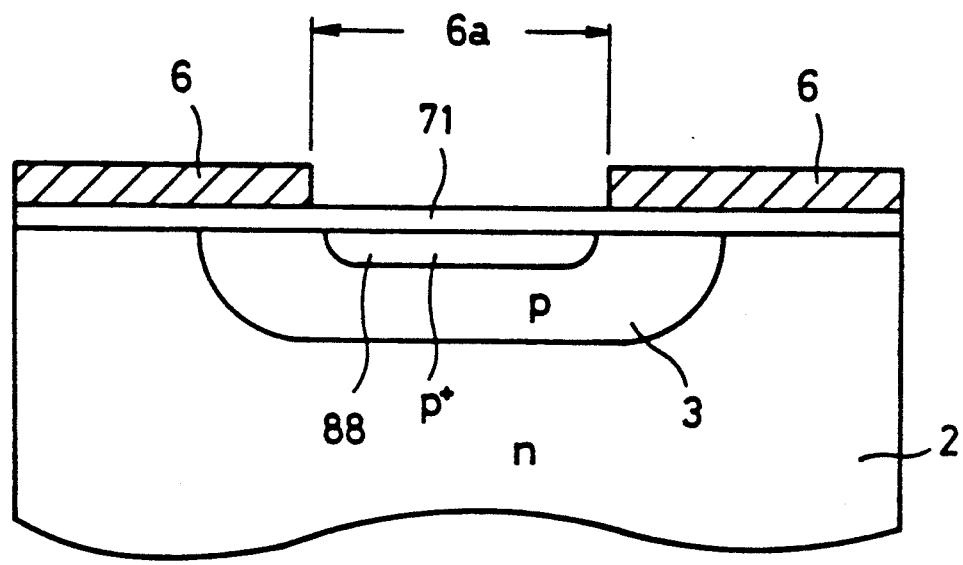

Then the process proceeds to the step of FIG. 30 (a section taken along the lines A3—A3 and B3—B3). The resist pattern 86 is removed, and the boron in the high-concentration p-type semiconductor region 87 is diffused by drive-in process to provide a high-concentration p-type semiconductor region 88. Since the sections of the mask pattern 57 used in the step of FIG. 29 taken along the lines A3—A3 and B3—B3 are of the same configuration, there is no difference in process between the two sections. The configuration of the mask pattern 57 and the conditions of diffusion of the high-concentration p-type semiconductor region 87 are suitably determined so that the high-concentration p-type semiconductor region 88 is located on the inside of the opening 6a of the electrode 6 (FIG. 30).

Figure 31:
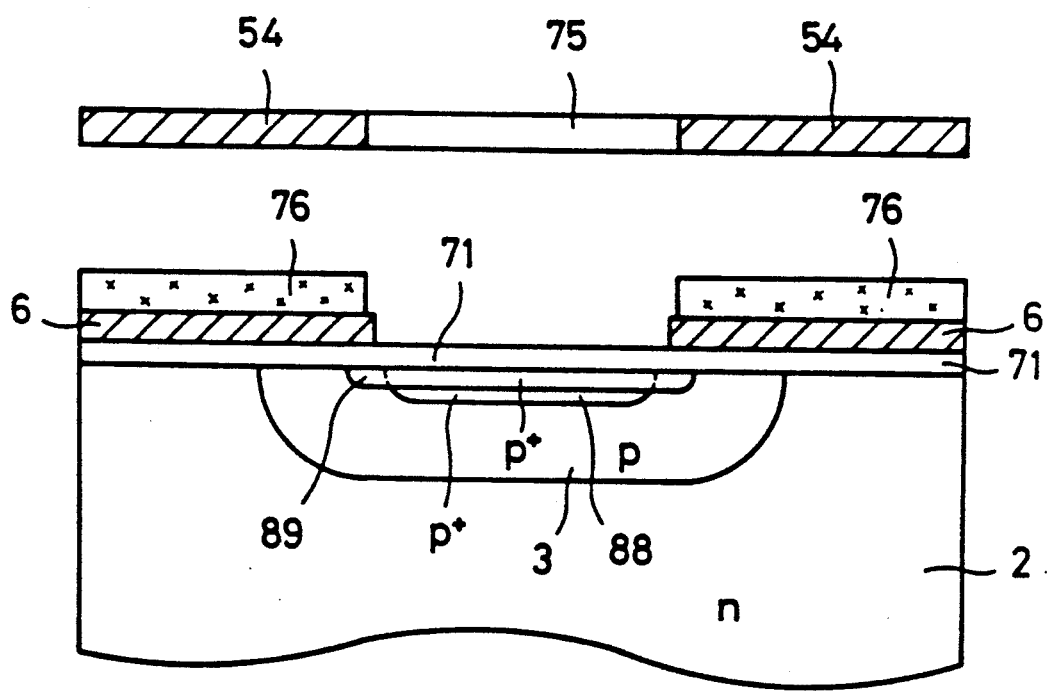
Figure 32:
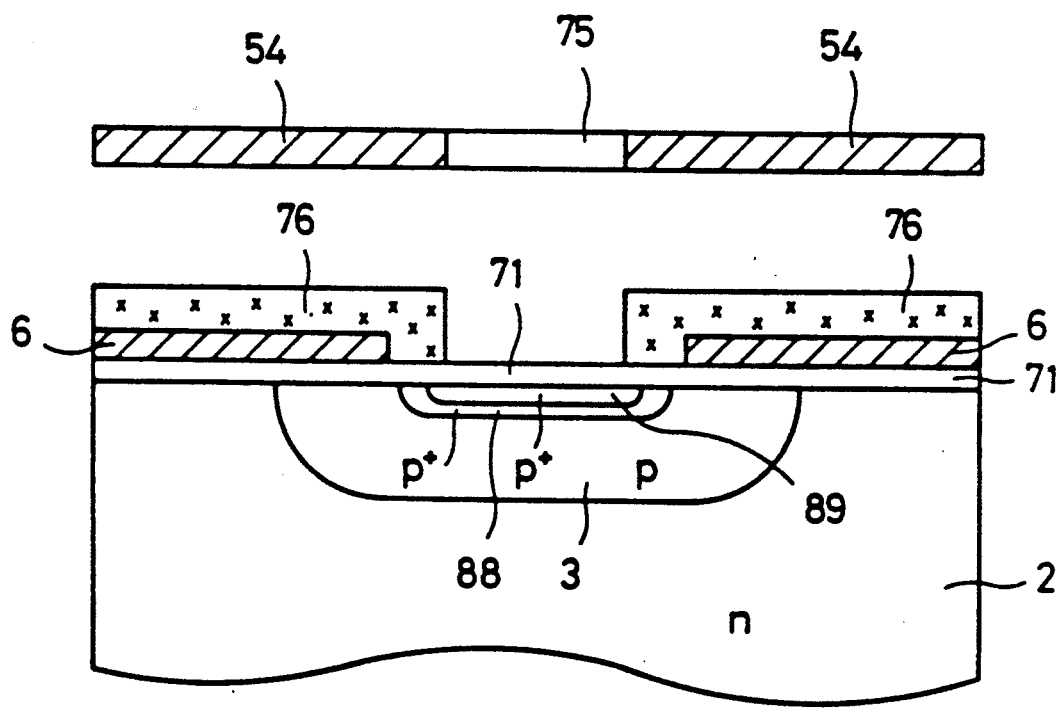

The step of FIG. 31 (a section taken along the line A3—A3) and FIG. 32 (a section taken along the line B3—B3) is carried out in the same fashion as the step of FIGS. 12 and 13 of the first preferred embodiment. Specifically, the resist pattern 76 is formed using the mask pattern 54, and the p-type base region 3 and high-concentration p-type semiconductor region 88 are selectively implanted with boron with relatively high concentration using the resist pattern 76 and gate electrode 6 as a mask to provide a high-concentration p-type semiconductor region 89.

Figure 33:
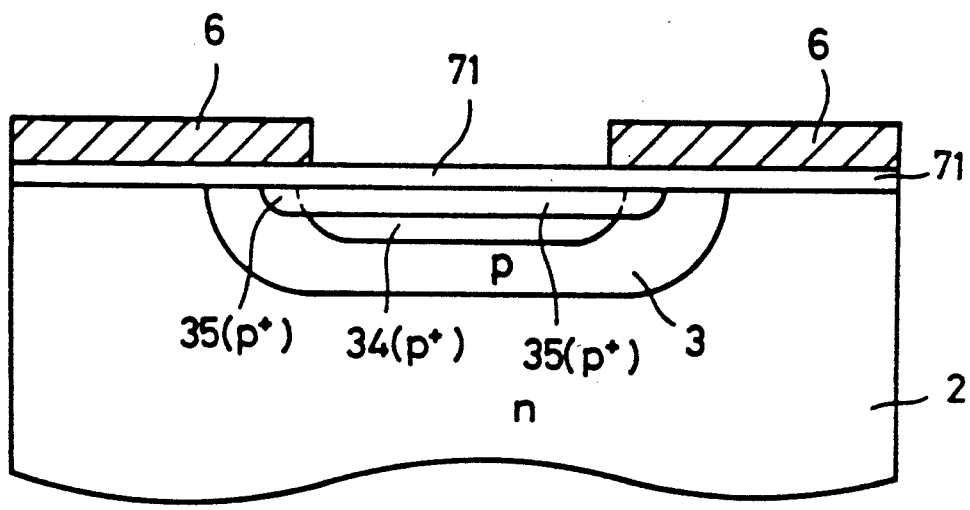
Figure 34:
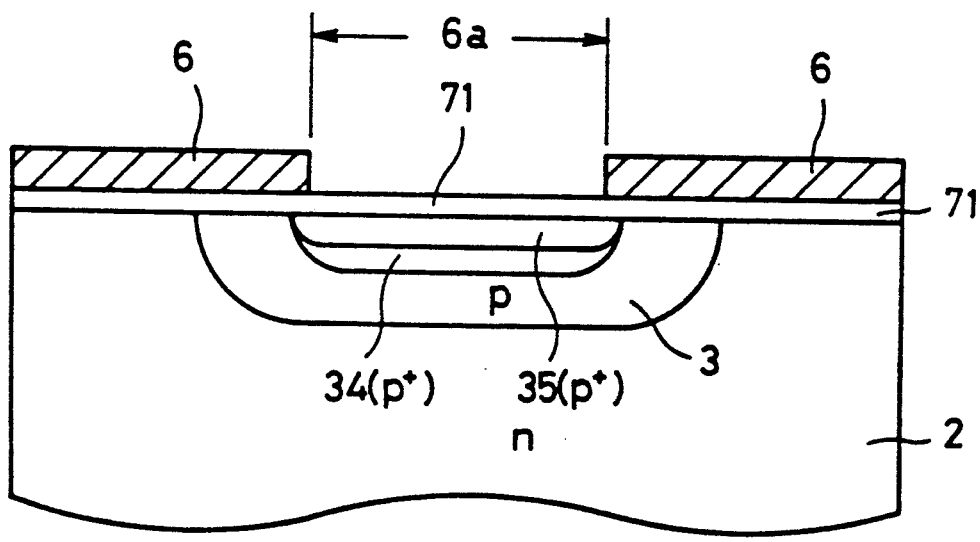

In the step of FIG. 33 (a section taken along the line A3—A3) and FIG. 34 (a section taken along the line B3—B3), the resist pattern 76 is removed, and the boron in the high-concentration p-type semiconductor region 89 is diffused by drive-in process to provide the high-concentration p-type semiconductor region 35 of FIGS. 27 and 28. At this time, the boron in the high-concentration p-type semiconductor region 88 is also diffused to provide the high-concentration p-type semiconductor region 34.

The succeeding process steps are the same as the process steps of FIGS. 16 to 22 of the first preferred embodiment.

4. Fourth Preferred Embodiment 4-1. Structure of Device

Figure 35:
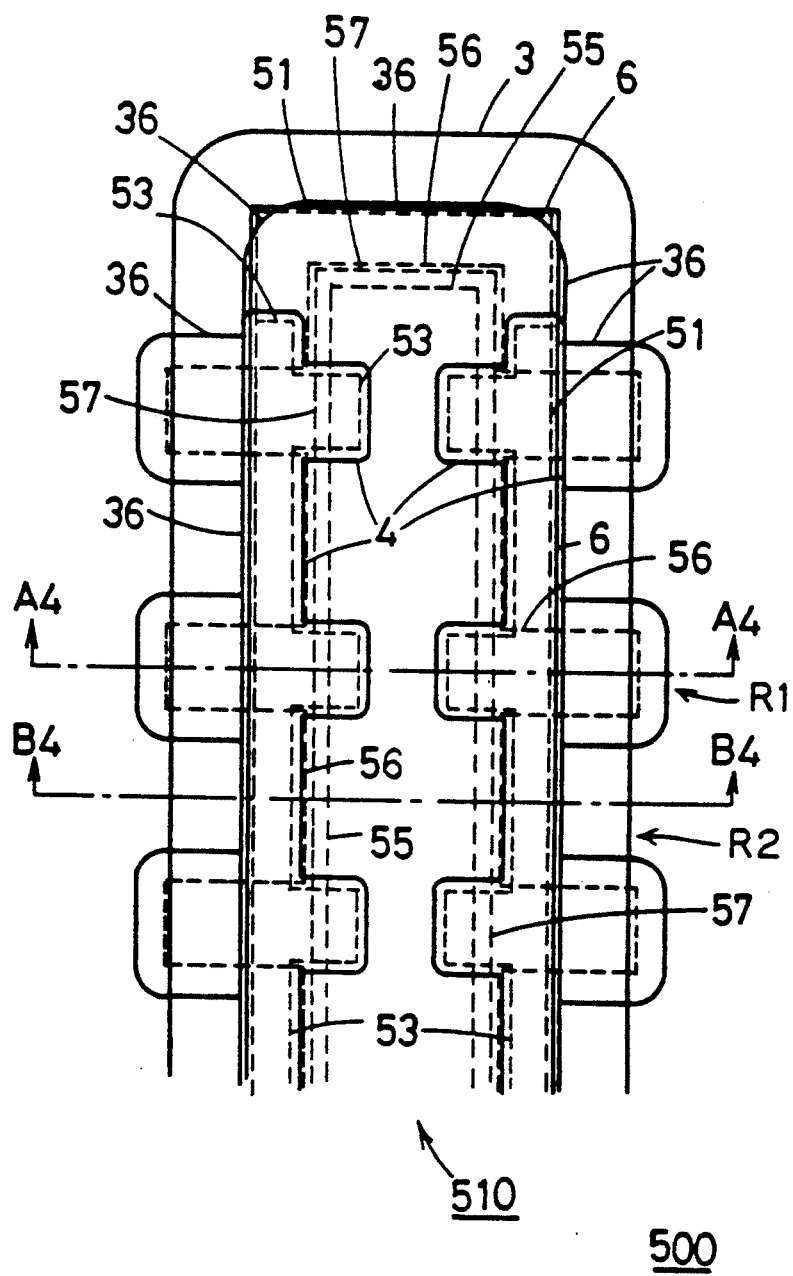
FIG. 35 is a plan view of an N-channel IGBT according to a fourth preferred embodiment of the present invention.
Figure 36:
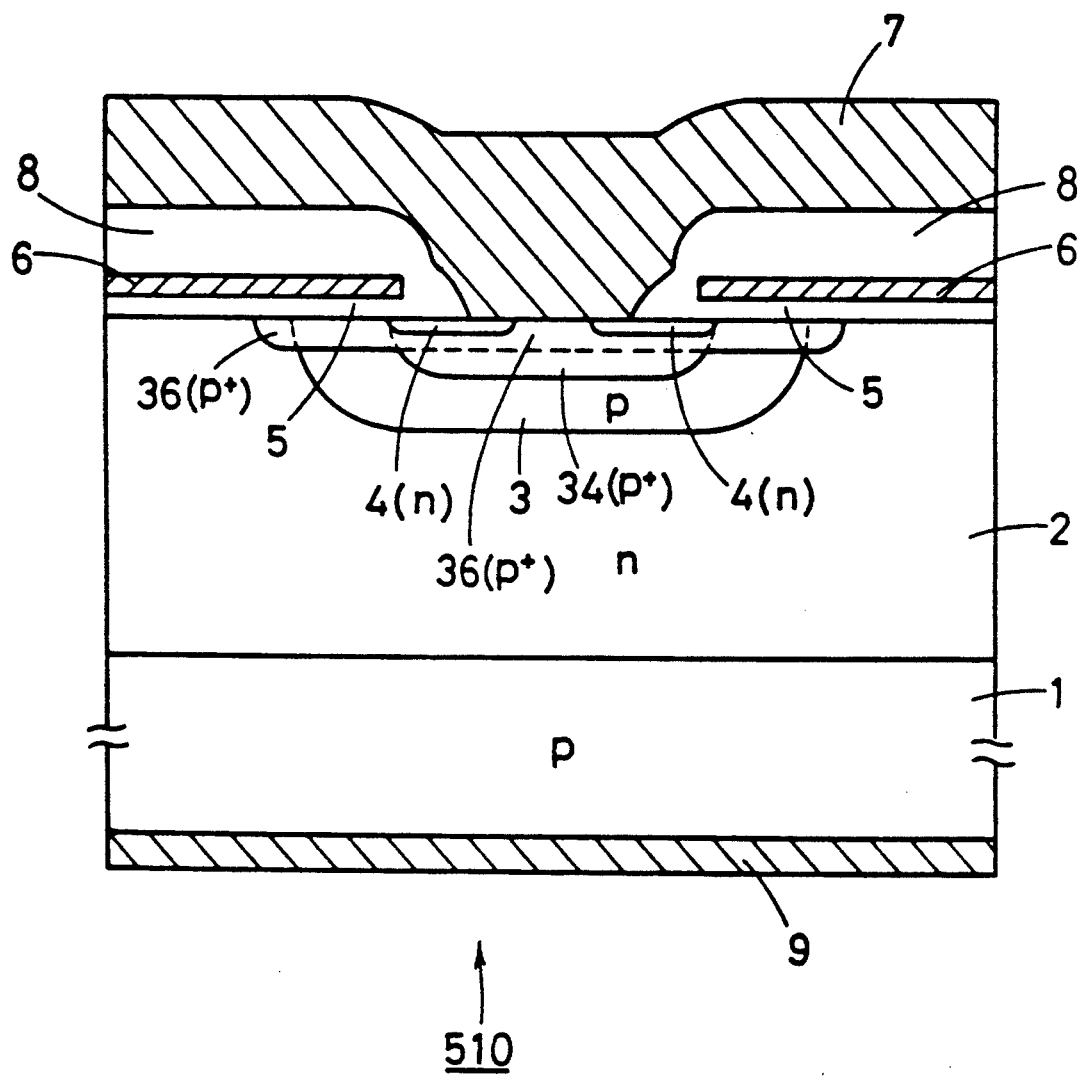
FIG. 36 is a cross-sectional view taken along the line A4—A4 of FIG. 35.

FIG. 35 is a plan view of an N-channel IGBT 500 according to a fourth preferred embodiment of the present invention. The IGBT 500 comprises a multiplicity of IGBT unit cells 510 connected in parallel as well as the IGBTs of the first to third preferred embodiments. The emitter electrode 7 and oxide film 8 are not illustrated in FIG. 35. The dotted lines of FIG. 35 represent the configurations of various mask patterns to be used in the process steps for fabrication of the IGBT 500. FIG. 36 is a cross-sectional view of one of the IGBT unit cells 510 taken along the line A4—A4 of FIG. 35.

The device of the fourth preferred embodiment has a combination of the features of the devices of the second and third preferred embodiments as shown in FIGS. 35 and 36. Similarly to the device of the third preferred embodiment, a high-concentration p-type semiconductor region 36 to be formed for providing the n-type channels having the relatively high gate threshold voltage $V_{GE}$(th-High) is formed independently of the high-concentration p-type semiconductor region 34 for suppression of the parasitic thyristor effect. Similarly to the device of the second preferred embodiment, the high-concentration p-type semiconductor region 36 extends over the p-type base region 3 into the n-type epitaxial layer 2 around the line A4—A4 where the n-type emitter regions 4 are relatively wide as viewed from the top. The cross-section taken along the line B4—B4 is of the same configuration as the cross-section taken along the line B3—B3 of the third preferred embodiment. That is, the cross-section taken along the line B4—B4 (not shown) is provided by replacing the high-concentration p-type semiconductor region 35 of FIG. 28 with the high-concentration p-type semiconductor region 36.

4-2. Characteristic of Device

The IGBT 500 of the fourth preferred embodiment constructed as above described has a combination of the characteristics of the devices of the second and third preferred embodiments. The channel length of the n-type channels having the relatively high gate threshold voltage $V_{GE}$(th-High) formed by the high-concentration p-type semiconductor region 36 in the same manner as the second preferred embodiment is longer than the channel lengths of the first and third preferred embodiments, so that the device of the fourth preferred embodiment is advantageously more effective for reduction in saturation current $I_{CE}$(sat). Furthermore, the high-concentration p-type semiconductor region 34 for reduction in saturation current $I_{CE}$(sat) and the high-concentration p-type semiconductor region 36 for suppression of the parasitic thyristor effect are optimized independently in the same manner as the third preferred embodiment, so that the device of the fourth preferred embodiment is more effective for both of the purposes.

4-3. Process Steps for Fabrication of Device

Figure 37:
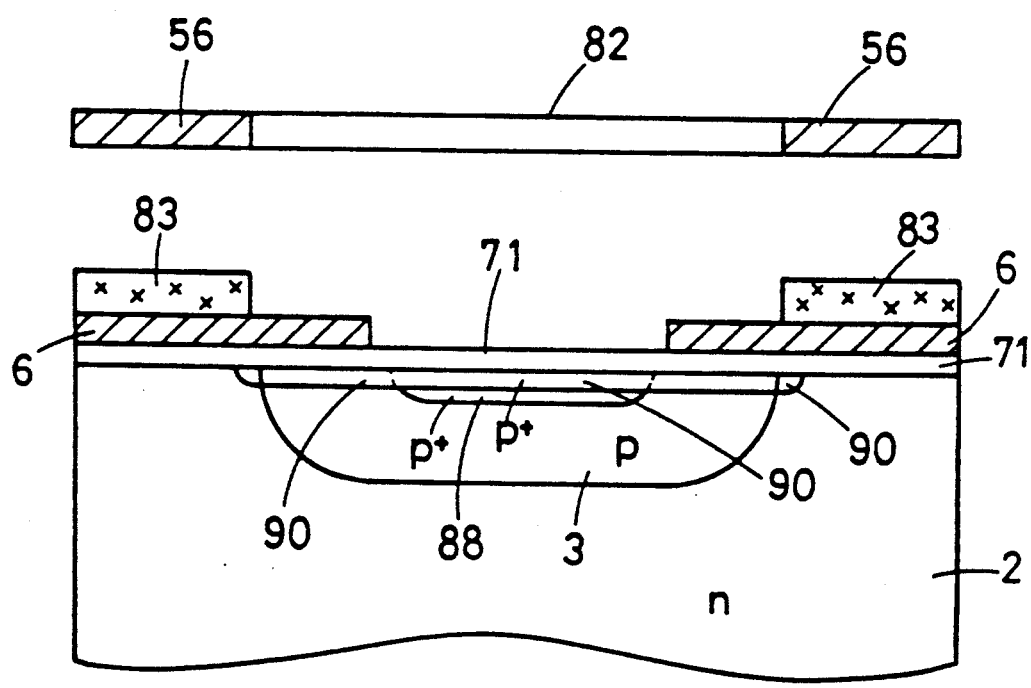
FIGS. 37 and 38 are cross-sectional views showing process steps for fabrication of the IGBT of FIG. 35.
Figure 38:
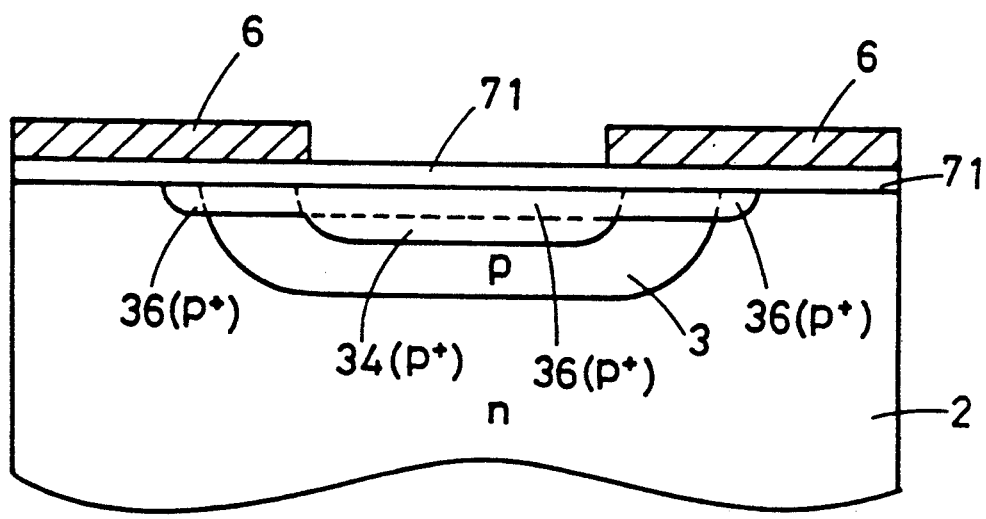

FIGS. 37 and 38 are cross-sectional views of the IGBT unit cell 510 taken along the line A4—A4 of FIG. 35 in a process step for fabrication of the IGBT 500. Referring to FIGS. 37 and 38, description will be given on the process steps for fabricating the IGBT 500 of the fourth preferred embodiment.

The same process steps as those down to the step of FIG. 30 of the third preferred embodiment are carried out. The process then proceeds to the step of FIG. 37. A resist layer is provided over the gate electrode 6 and silicon oxide film 71. Photolithography process is carried out on the resist layer using the mask 82 having a pattern corresponding to the mask pattern 56 of FIG. 35 to provide the resist pattern 83 corresponding to the mask pattern 56. The high-concentration p-type semiconductor region 88, p-type base region 3 and n-type epitaxial layer 2 are selectively implanted with boron with high energy with high concentration using the resist pattern 83 as a mask to provide a high-concentration p-type semiconductor region 90.

The process then proceeds to the step of FIG. 38. The resist pattern 83 is removed, and the boron in the high-concentration p-type semiconductor region 90 is diffused by drive-in process to provide the high-concentration p-type semiconductor region 36. At this time, the boron in the high-concentration p-type semiconductor region 88 is also diffused to provide the high-concentration p-type semiconductor region 34. Since the mask pattern 56 used in the step of FIG. 37 is shaped so that it is wide around the line A4—A4 of FIG. 35 and narrow around the line B4—B4 of FIG. 35, the high-concentration p-type semiconductor region 36 extends to the part of the n-type epitaxial layer 2 which underlies the gate electrode 6 around the line A4—A4. The cross-section taken along the line B4—B4 after this process step is provided by replacing the high-concentration p-type semiconductor region 35 in the cross-section taken along the line B3—B3 of the third preferred embodiment shown in FIG. 34 with the high-concentration p-type semiconductor region 36. The high-concentration p-type semiconductor regions 34 and 36 are confined to the inside of the opening 6a of the gate electrode 6. The succeeding process steps are the same as the process steps succeeding the step of FIGS. 33 and 34 of the third preferred embodiment.

5. Modifications (1) In the above-mentioned preferred embodiments, the high-concentration p-type semiconductor regions 32, 33, 35 and 36 in which the n-type channels having the relatively high gate threshold voltage $V_{GE}$(th-High) are to be formed are provided in the regions R1 in which the n-type emitter regions 4 are relatively wide as viewed from the top for the purpose of causing the high-concentration p-type semiconductor regions 32, 33, 35 and 36 to effectively function to suppress the parasitic thyristor effect. The parts of the high-concentration p-type semiconductor regions in which the n-type channels having the relatively high gate threshold voltage $V_{GE}$(th-High) are to be formed may be provided in the other regions. In this case, the effect of reducing the saturation current $I_{CE}$(sat) is obtained.

Figure 39:
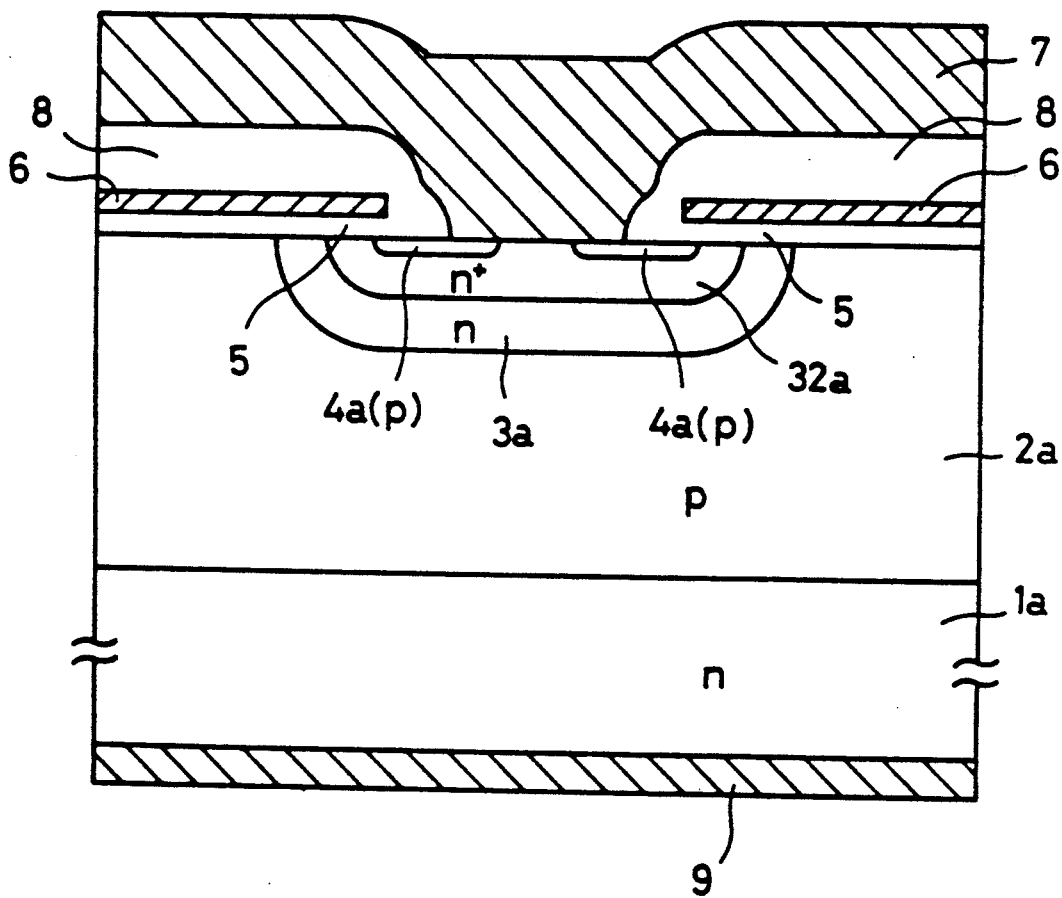
FIG. 39 is a front sectional view of a modification of the N-channel IGBT according to the present invention.

(2) Although the devices of the above-mentioned preferred embodiments are the N-channel IGBT, the present invention may be applied to a P-channel IGBT having the semiconductor layers of reverse polarities. FIG. 39 illustrates a device comprising the semiconductors having the polarities reverse to those of the first preferred embodiment. FIG. 39 is a front sectional view of an IGBT unit cell in a corresponding position to FIG. 2. The polarities of the semiconductor layers 1a to 4a and 32a of FIG. 39 are reverse to those of the semiconductor layers 1 to 4 and 32 of FIG. 2.

(3) In the above-mentioned preferred embodiments, the gate voltage $V_{GE}$ is larger than the gate threshold voltage $V_{GE}$(th-High). The impurity concentration of the high-concentration p-type semiconductor regions 32 and 33 may be increased so that the gate voltage $V_{GE}$ is not larger than the gate threshold voltage $V_{GE}$(th-High). In this case, the effect for reduction in collector-emitter saturation voltage $V_{CE}$(sat) is lessened to some degree, however, the effect for reduction in saturation current $I_{CE}$(sat) is enhanced to provide a higher short-circuit tolerance.

(4) The region having the high gate threshold voltage $V_{GE}$(th) need not be located uniformly in all of the IGBT unit cells but may be located in a particular portion in the IGBT chip. For example, the location of the region such that the concentration of the collector current Ic is suppressed on the patterns of the IGBT chip provides for a similarly improved effect.

(5) The present invention is not limited to IGBTs but may be applied to general insulated gate semiconductor devices (e.g., power MOSFETs, ESTs, MCTs and the like).

While the invention has been shown and described in detail, the foregoing description is in all aspects illustrative and not restrictive. It is therefore understood that numerous modifications and variations can be devised without departing from the scope of the invention.

We claim:

1. An insulated gate semiconductor device comprising:
   (a) a semiconductor body comprising:
      (a-1) a first semiconductor region of a first conductivity type exposed at a top major surface of said semiconductor body;
      (a-2) a second semiconductor region of a second conductivity type selectively formed in a top surface portion of said first semiconductor region and selectively exposed at said top major surface of said semiconductor body;
      (a-3) a third semiconductor region of the first conductivity type selectively formed in a top surface portion of said second semiconductor region and exposed at said top major surface of said semiconductor body on the inside of a peripheral edge portion of the exposed surface of said second semiconductor region,
   wherein said third semiconductor region defines a pattern on said top major surface of said semiconductor body, said pattern including a pair of strip areas arranged in parallel separately by a central area;
      (a-4) a fourth semiconductor region of the second conductivity type having an impurity concentration higher than an impurity concentration of said second semiconductor region and selectively formed in a top surface portion of said semiconductor body so as to surround said third semiconductor region, said fourth semiconductor region comprising:
   a first portion exposed at said top major surface of said semiconductor body in said central area and extending beneath the third semiconductor region; and
   a second portion exposed at said top major surface of said semiconductor body in an external area selectively defined on the outside of said pair of strip areas;
   (b) an insulating layer selectively formed on said top major surface of said semiconductor body and having an opening on a predetermined region covering part of said pair of strip areas and at least part of said central area;
   (c) a control electrode layer buried in said insulating layer and opposed to the exposed surfaces of said second semiconductor region and said second portion of said fourth semiconductor region between said pair of strip areas of said third semiconductor region and the exposed surface of said first semiconductor region;

(d) a first main electrode layer formed in said opening and electrically connected to a portion of said top major surface of said semiconductor body exposed in said opening; and (e) a second main electrode layer formed on a bottom major surface of said semiconductor body and electrically connected to said semiconductor body.

2. The insulated gate semiconductor device of claim 1, wherein said pair of strip areas includes first and second strip areas, and said pattern further includes first and second teeth projecting said first and second strip areas toward said central area, respectively.

3. The insulated gate semiconductor device of claim 2, wherein said first and second teeth are connected to each other, whereby said pattern defines a ladder pattern.

4. The insulated gate semiconductor device of claim 2, wherein said external area is aligned with said first and second teeth.

5. The insulated gate semiconductor device of claim 4, wherein said external area is extended to the area in which said first semiconductor region is exposed to said top major surface of said semiconductor body.

6. The insulated gate semiconductor device of claim 4, wherein said fourth semiconductor region comprises:

(a-4-1) a third portion selectively exposed to said top major surface of said semiconductor body; and (a-4-2) a fourth portion selectively projecting from a bottom of said first portion into said second semiconductor region.

7. The insulated gate semiconductor device of claim 6, wherein said fourth portion has said impurity concentration higher than said impurity concentration in said third portion.

8. The insulated gate semiconductor device of claim 1, wherein said semiconductor body further comprises:

(a-5) a fifth semiconductor region of the second conductivity type formed under said first semiconductor region and exposing said bottom surface of said semiconductor body.

9. The insulated gate semiconductor device of claim 1, wherein said first main electrode contacts exposed portions of said third and fourth semiconductor regions in said opening, the exposed portions of said third semiconductor region contacting said first main electrode have an area A1, the exposed portions of said fourth semiconductor region contacting said first main electrode have an area A2, and a ratio $A1/(A1+A2)$ is less than 50%.

10. The insulated gate semiconductor device of claim 1, wherein said external area comprises a plurality of unit external areas periodically aligned at a predetermined period $(H+L)$ in an elongated direction of said pair of strip areas, and a percentage of the length (H) of each unit external area in said elongated direction of said pair of strip areas to said period $(H+L)$ is not less than 20%.

* * * * *